(12) United States Patent
Bhosale et al.

(10) Patent No.: US 8,643,220 B1
(45) Date of Patent: Feb. 4, 2014

(54) TOGGLE SWITCH AND VARIABLE ACTUATOR CONTROL

(75) Inventors: Vikramsinh P. Bhosale, West Babylon, NY (US); Patrick J. Murphy, Marcellus, NY (US); Richard M. Rohmer, Jordan, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 956 days.

(21) Appl. No.: 12/730,415

(22) Filed: Mar. 24, 2010

(51) Int. Cl.
*H01H 31/10* (2006.01)

(52) U.S. Cl.
USPC .......................................................... 307/115

(58) Field of Classification Search
USPC ............................. 307/115; 200/330, 339, 553
See application file for complete search history.

(56) References Cited

U.S. PATENT DOCUMENTS

| | | | |
|---|---|---|---|
| 5,262,678 A * | 11/1993 | Flowers et al. | 307/125 |
| 5,293,103 A * | 3/1994 | Hanna | 318/268 |
| 5,359,231 A | 10/1994 | Flowers | |
| 5,637,930 A | 6/1997 | Rowen | |
| D523,402 S | 6/2006 | Lombardi | |
| D603,809 S | 11/2009 | Matthew | |
| 8,124,898 B2 * | 2/2012 | Mathew et al. | 200/330 |
| 8,350,494 B2 * | 1/2013 | Snook et al. | 315/291 |

* cited by examiner

*Primary Examiner* — Rexford Barnie
*Assistant Examiner* — Joseph Inge
(74) *Attorney, Agent, or Firm* — Daniel P. Malley; Bond Schoeneck & King, PLLC

(57) ABSTRACT

The present invention is directed to a device for controlling electrical power provided to at least one electrical load. The actuator retainer housing includes a toggle actuator disposed adjacent to a variable control actuator in a side-by-side arrangement within the actuator retainer housing with no framing or support structure disposed therebetween. The variable control actuator includes a rotatable axial variable control mounting structure coupled to the actuator retainer housing. The axial toggle mounting structure and the axial variable control mounting structure are substantially parallel to a central latitudinal axis. An electronic control circuit is coupled to the plurality of control terminals and the modular switch actuation assembly. The electronic control circuit is configured to respond to actuations of the toggle actuator and/or the variable control actuator.

54 Claims, 18 Drawing Sheets

SECTION A-A

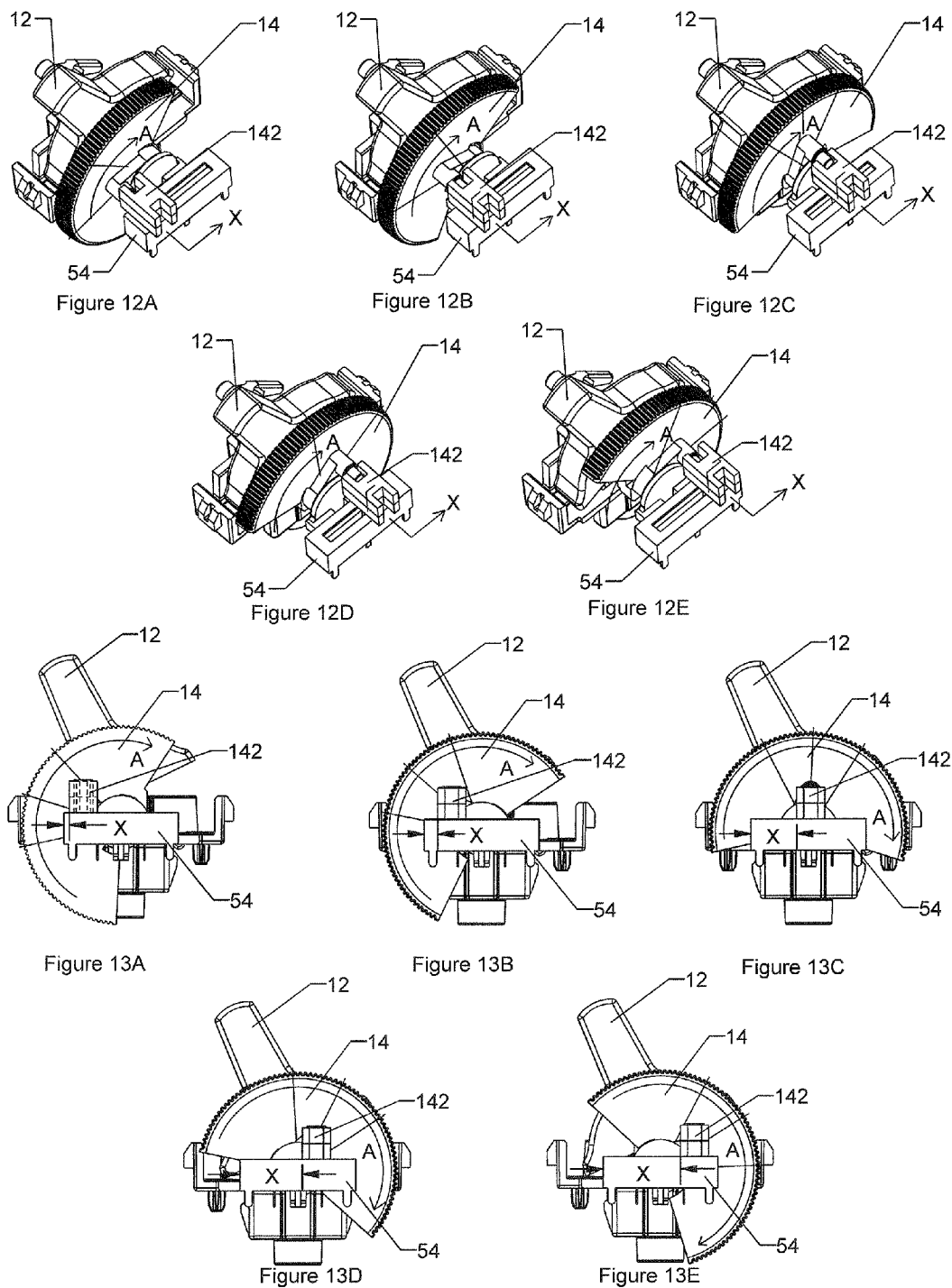

SECTION A-A

SECTION A-A

SECTION A-A

DETAIL A
SCALE 4

TOGGLE SWITCH AND VARIABLE ACTUATOR CONTROL

BACKGROUND OF THE INVENTION

1. Field of the Invention

The present invention relates generally to lighting control, and particularly to toggle switch and variable actuator control mechanism.

2. Technical Background

A toggle switch in combination with a variable actuator control mechanism, e.g., a dimmer, is a device that controls a load with two separate actuators. One of these is a single pole single throw (SPST) switch or a single pole double throw (SPDT) switch. The SPST is an ON-OFF switch that may be connected to a single electrical load or multiple loads in parallel. The SPDT switch may be employed to switch between two loads, i.e., when one load is ON, the other load is OFF, and vice-versa. Two SPDT switches may be employed in combination to control a single load from two separate locations. In each of these examples, a load, such as a lighting device, is either ON or OFF. In addition to the toggle switch, many consumers often prefer a control mechanism that includes a variable actuator control mechanism configured to efficiently control the amount of power being provided to the a, e.g., the intensity of the emitted light. The user may adjust the variable actuator control mechanism setting as needed or as desired. Some variable actuator control mechanisms include automatic variable actuator controls that adjust the light intensity based on ambient light conditions.

A variable actuator control mechanism, such as a dimmer, may be implemented using an RC control circuit in combination with a thyristor such as a TRIAC. The TRIAC is a bidirectional electronic switch that is configured to conduct current in either direction when it is turned ON. The TRIAC may be turned ON by applying a positive or a negative voltage to the TRIAC gate. The TRIAC is a very convenient way to control the amount of AC power consumed by the lighting device because the TRIAC may be turned ON and OFF in response to a pulsed signal applied to the gate. In practice, the ON/OFF cycle of the TRIAC is often controlled by an RC circuit. The resistor portion of the RC circuit is typically implemented using a potentiometer. A potentiometer is a resistor with a sliding contact that forms an adjustable resistance value. The potentiometer is employed by the user to adjust the value of the resistance to thereby change the RC time constant of the RC circuit. Thus, when 60 Hz AC power is applied to the RC circuit, the RC time constant is adjusted via the potentiometer to adjust the duty cycle of the control signal applied to the gate of the TRIAC. When the duty cycle is relatively low, the TRIAC is ON for a relatively small portion of the AC cycle and the light is relatively dim. When the duty cycle is relatively high, the TRIAC is ON for a relatively long portion of the AC cycle and the light appears to be relatively bright. In addition to lighting control circuits, TRIACs may also be employed in speed control circuits for electric motors (e.g., electric fans) and other appliances.

One of the issues of concern to variable actuator control mechanism designers relates to the thermal energy generated by the electrical components of the device. The TRIAC, in particular, generates a significant amount of heat. This concern is exacerbated in toggle switch and variable actuator control mechanisms that include the switch control and variable actuator control within a standard NEMA No. 1 cover plate opening i.e., 0.925" (minimum) high by 0.401" (minimum) wide, because the electrical components tend to be disposed within a central region of the device housing. One common technique for mitigating the thermal energy generated by the components is to mount the TRIAC on a heat sink/ground plane. While the heat sinking of the TRIAC improves the thermal performance of the device, the side of the TRIAC opposite the heat sink is not thermally isolated from the interior of the device housing. What is needed, therefore, is a toggle switch/variable actuator control combination switch designed for a standard NEMA No. 1 cover plate opening that more effectively isolates the TRIAC from the device interior and spatially separates the electrical components to obtain improved thermal performance.

Another issue that is of concern relates to the costs associated with the toggle dimmer assembly. In state of the art devices, the front body member typically includes a framed portion that accommodates both the toggle switch and the dimmer actuator. The toggle actuator and the dimmer actuator are typically fabricated as separate pieces that extend through their respective framing slots and mate with their respective interfaces on the circuit board. One drawback to this approach relates to the time associated with assembling the various and disparate pieces (including the actuator pieces, the interface pieces, etc.). Thus, what is needed is a modular switching assembly that easily incorporates the various pieces of the toggle dimmer assembly such that the entire modular assembly may be snapped in place on the printed circuit board. This approach saves time and therefore money.

SUMMARY OF THE INVENTION

The present invention addresses the needs described above by providing a modular switching assembly that includes a toggle switch/variable actuator control combination switch that addresses the needs described above.

One aspect of the present invention is directed to a device for controlling electrical power provided to at least one electrical load. The device is configured to be mountable in a wall box and covered by a wall plate having a wall plate opening disposed in a substantially central portion of the wall plate. The device has a device housing including a front body member coupled to a back body member. The front body member includes a front major surface including a front major surface opening disposed at a substantially central portion thereof in substantial alignment with the wall plate opening. The front major surface opening is characterized by at least one longitudinal side and at least one latitudinal side. The back body member includes a plurality of control terminals. A modular switch actuation assembly includes an actuator retainer housing coupled to the device housing. The actuator retainer housing includes a toggle actuator disposed adjacent to a variable control actuator in a side-by-side arrangement within the actuator retainer housing with no framing or support structure disposed therebetween. The toggle actuator and the variable control actuator extend through the front major surface opening. The variable control actuator includes a control surface disposed adjacent a substantial portion of the at least one longitudinal side. The toggle actuator includes a rotatable axial toggle mounting structure coupled to the actuator retainer housing. The variable control actuator includes a rotatable axial variable control mounting structure coupled to the actuator retainer housing. The axial toggle mounting structure and the axial variable control mounting structure are substantially parallel to a central latitudinal axis. The actuator retainer housing includes a stopping portion configured to limit a rotational movement of the toggle actuator between a first predefined position and a second predefined position. An electronic control circuit is coupled to the plurality of control terminals and the modular switch actuation assembly. The electronic control circuit is configured to respond to actuations of the toggle actuator and/or the variable control actuator.

In another aspect, the present invention is directed to a device for controlling electrical power provided to at least one electrical load, the device being configured to be mountable in a wall box and covered by a wall plate having a wall plate opening disposed in a substantially central portion of the wall plate. The device includes a device housing characterized by a longitudinal axis and a latitudinal axis. The device housing includes a front body member coupled to a back body member. The front body member includes a front major surface having a front major surface opening disposed at a substantially central portion thereof in substantial alignment with the wall plate opening. The back body member includes a plurality of control terminals. A modular switch actuation assembly includes an actuator retainer housing having at least one mounting structure configured to be coupled to the device housing. The actuator retainer housing also includes a toggle actuator disposed adjacent to a variable control actuator in a side-by-side arrangement extending through the front major surface opening. The actuator retainer housing is substantially bisected by the longitudinal axis. The toggle actuator includes an axial toggle mounting structure coupled to the actuator retainer housing and the variable control actuator including an axial variable control mounting structure coupled to the actuator retainer housing. The axial toggle mounting structure and the axial variable control mounting structure are substantially parallel to the latitudinal axis. The actuator retainer housing includes a stopping portion configured to limit a rotational movement of the toggle actuator between a first predefined position and a second predefined position. An electronic control circuit includes a variable impedance control element coupled to the variable control actuator by a linkage mechanism. The linkage element converting a variable control actuator motion into a linear variable impedance control motion. The variable impedance control element being configured to control the electrical power provided to the at least one load via the variable control actuator. The variable impedance control element is disposed in a first lateral portion of the device housing and characterized by a first major axis that is parallel to and off-set from the longitudinal axis by the linkage mechanism.

In yet another aspect, the present invention is directed to a device for adjustably controlling electrical power to at least one electrical load, the device being configured to be mountable in a wall box and covered by a wall plate having a single substantially central wall plate opening. The device includes a device housing characterized by a longitudinal axis and a latitudinal axis. The device housing includes a front body member coupled to a back body member. The front body member includes a front major surface including a front major surface opening disposed at a substantially central portion thereof in substantial alignment with the wall plate opening. The back body member includes a plurality of control terminals. A printed circuit board member includes an electronic control circuit. The electronic control circuit includes a slide potentiometer offset from the longitudinal axis and disposed along a first lateral edge of the printed circuit board member. The electronic control circuit includes a switch contact arrangement offset from the longitudinal axis and disposed along a second lateral edge of the printed circuit board member opposite the first lateral edge. The printed circuit board member includes a board opening disposed between the slide potentiometer and the switch contact arrangement. An electronic power regulator is coupled to the electronic control circuit and disposed in a vented region of the front body member. The vented region including a thermal isolation barrier between the electronic power regulator and the printed circuit board. An actuator retainer housing includes a lower housing portion disposed in the board opening and coupled to the printed circuit board member. The actuator retainer housing also includes a switching device disposed adjacent to a variable rotary control actuator in a side-by-side arrangement extending through the front major surface opening. The switching device includes a switch actuator operatively coupled to the switch contact arrangement. The switching device is configured to move the switch actuator between a first switch position and a second switch position. The variable rotary control actuator including a linkage member configured to convert a variable rotary control actuator movement into a slide actuation of the slide potentiometer.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention and together with the description serve to explain the principles and operation of the invention.

BRIEF DESCRIPTION OF THE DRAWINGS

FIGS. 12A-12E are perspective views of the variable actuator, variable actuator linkage and potentiometer at various potentiometer settings;

FIGS. 13A-13E are side views of the variable actuator, variable actuator linkage and potentiometer at the various potentiometer settings shown in FIGS. 12A-12E;

DETAILED DESCRIPTION

Figure 1:
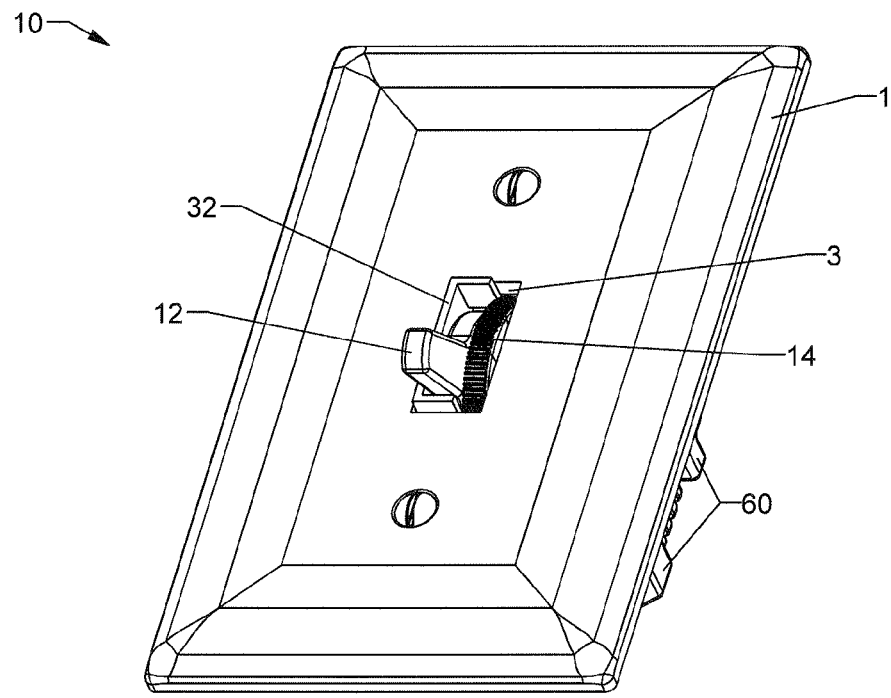
FIG. 1 is a perspective view of a half-frame toggle switch and variable actuator control mechanism with a cover plate in accordance with an embodiment of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the toggle switch and variable actuator control device of the present invention is shown in FIG. 1, and is designated generally throughout by reference numeral 10.

As embodied herein, and depicted in FIG. 1, a perspective view of a half-frame toggle switch and variable actuator control device 10 with a cover plate 1 in accordance with an embodiment of the present invention is disclosed. The cover plate 1 includes a standard NEMA No. 1 opening 3. Thus, the dimensions of opening 3 are substantially equal to about 0.925"×0.401". The toggle switch 12 and the rotary variable actuator 14 extend through the wall plate opening 3 such that they are accessible to a user. In this embodiment, a separator member 30 (not shown in FIG. 1) includes a half-frame that extends around the toggle switch 12 and not around the rotary variable actuator 14. Those of ordinary skill in the art will understand that when the load is a light, the rotary variable actuator 14 will be implemented as a dimmer control.

Figure 2:
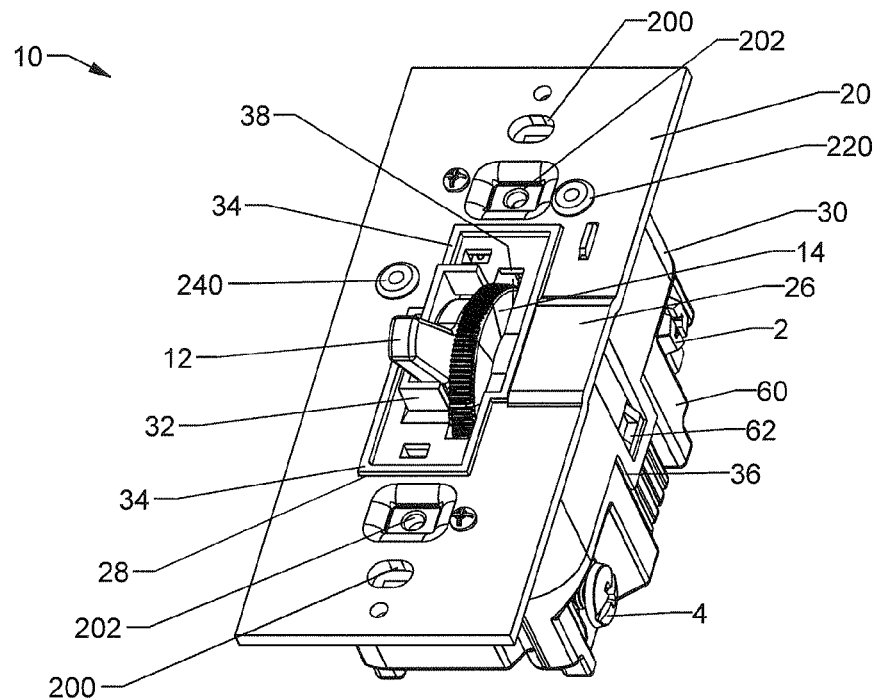
FIG. 2 is a perspective view of the half-frame toggle switch and variable actuator control mechanism depicted in FIG. 1 without the cover plate.

Referring to FIG. 2, a perspective view of the half-frame toggle switch and variable actuator control device 10 depicted in FIG. 1 without the cover plate 1 is disclosed. The heat sink 20, serving as a front cover, includes wall box mounting holes 200 at either end thereof. Closer to the center, the heat sink 20 also includes recessed wall plate fastening holes 202 at either end thereof. The ground terminal post 22 (not shown in this view) is attached to heat sink 20 by rivet 220. TRIAC 24 (also not shown in this view) is attached to heat sink 20 by rivet 240. The heat sink 20 includes a raised portion 26 that formed a variable actuator link recess underneath heat sink 20. The heat sink 20 also includes an irregularly shaped opening 28. Separator 30 includes a registration edge 34 that substantially conforms to opening 28 and aligns the separator 30 with heat sink 20. The half-frame 32 extends from a planar front surface of separator 30 within the boundary formed by registration edge 34. Separator 30 also includes an opening 38 that provides access to the toggle switch 12 and the rotary actuator 14.

The separator 30 is also shown underneath heat sink 20 and includes a latch 36 that mates with back body snap 62. The back body 60 also provides access to various wiring terminals. For example, ground screw terminal 2 is employed to terminate the ground wire to the ground terminal post 22 (not shown in this view). Line hot screw terminal 4 is used to terminate the line hot conductor. If the present invention is configured as a SPDT switch, the other side of the device 10 (not shown in this view) will include two traveler terminals 6 which, of course, are used to terminate traveler wires in a lighting circuit.

As noted above, those of ordinary skill in the art will understand that an SPDT switch may be employed in various types of circuit arrangements. For example, an SPDT switch may be used to switch between two loads, i.e., when one load is ON, the other load is OFF, and vice-versa. Two SPDT switches may be employed in combination to control a single load from two separate locations. Of course, if one of the traveler terminals in left unconnected, the SPDT will function as a SPST switch and can be used to turn the electrical load between the ON and OFF positions. Those of ordinary skill in the art will understand that when the load is a light, the rotary variable actuator 14 will be implemented as a dimmer control.

Figure 3:
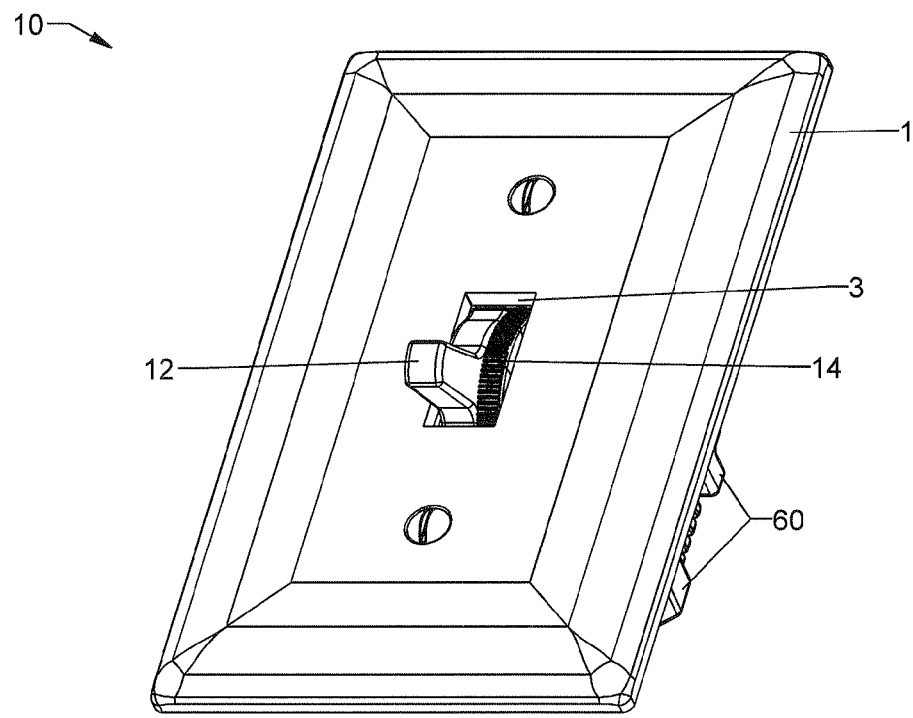
FIG. 3 is a perspective view of a frameless toggle switch and variable actuator control mechanism with a cover plate in accordance with another embodiment of the present invention.

As embodied herein and depicted in FIG. 3, a perspective view of a frameless toggle switch and variable actuator control device 10 with a cover plate 1 in accordance with another embodiment of the present invention is disclosed. The cover plate 1 includes a standard NEMA No. 1 opening 3. The minimum dimensions, therefore, are about 0.925 inches by 0.401 inches or thereabout. The area occupied by the No. 1 opening is less than or equal to about 0.5 inches square. The toggle switch 12 and the rotary variable actuator 14 extend through the wall plate opening 3 such that they are accessible to a user. In this embodiment, the separator member 30 does not include a frame member.

Figure 4:
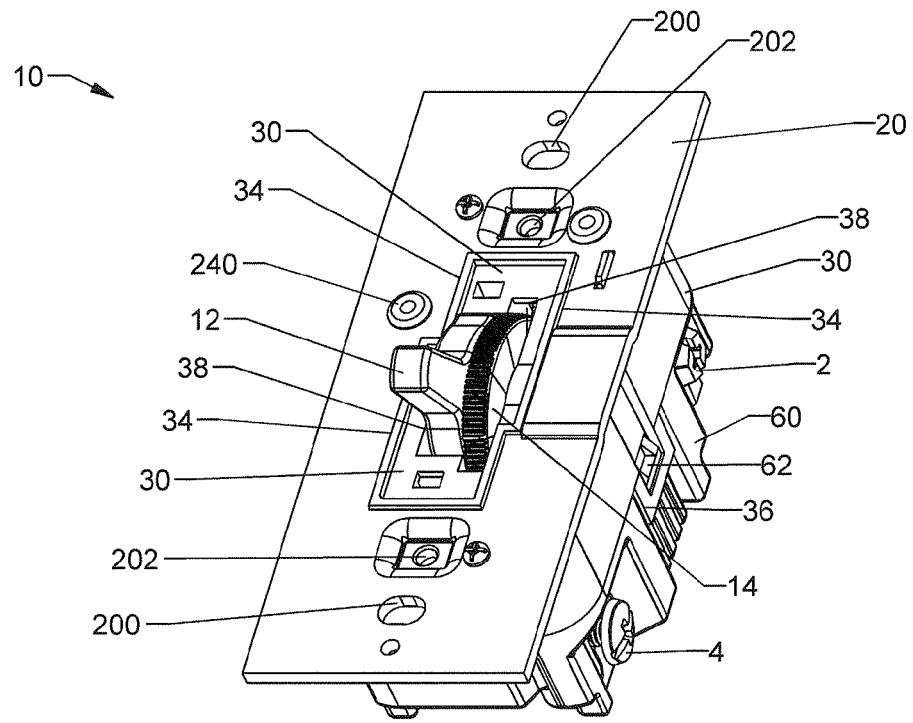
FIG. 4 is a perspective view of the frameless toggle switch and variable actuator control mechanism depicted in FIG. 3 without the cover plate.

Referring to FIG. 4, a perspective view of the frameless toggle switch and variable actuator control device 10 depicted in FIG. 3 without the cover plate 1 is disclosed. All of the features depicted in FIG. 2, and their corresponding reference numerals, are identical in FIG. 4 with the exception that the separator 30 embodiment of FIG. 4 does not include a half-frame 32. Reference is made to U.S. Design patent application Nos. 29/352,130 and 29/352,132, both of which were filed on Dec. 17, 2009, which are incorporated herein by reference as though fully set forth in their entirety, for a more detailed explanation of various design features of the toggle actuator 12, rotary actuator 14 and frameless or half-framed separator 30.

Figure 5:
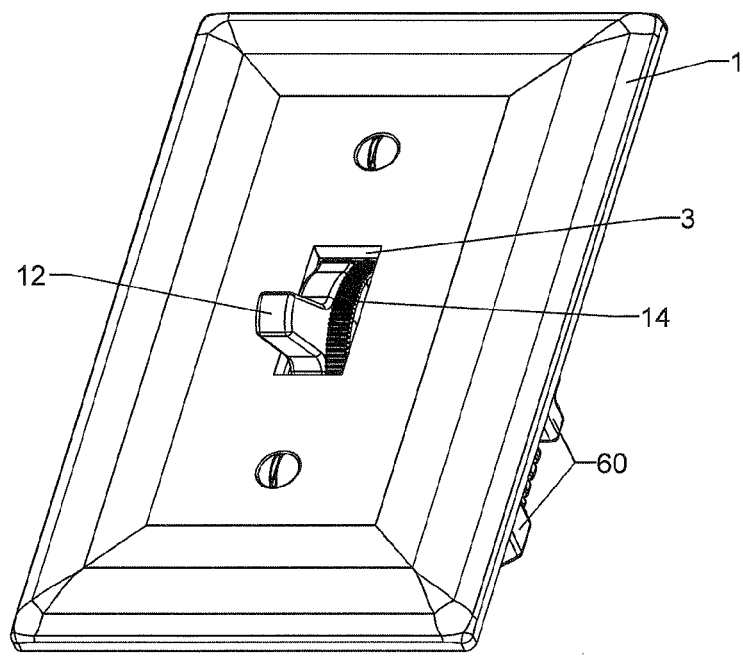
FIG. 5 is a perspective view of a frameless toggle switch and variable actuator control mechanism with a cover plate in accordance with another embodiment of the present invention.

Referring to FIG. 5, a perspective view of a frameless toggle variable actuator switch 10 with a cover plate 1 in accordance with another embodiment of the present invention is disclosed. The cover plate 1 again includes a standard NEMA No. 1 opening 3. The toggle switch 12 and the rotary variable actuator 14 extend through the wall plate opening 3 such that they are accessible to a user. Once again, in this embodiment, the separator member 30 does not include a frame member.

Figure 6:
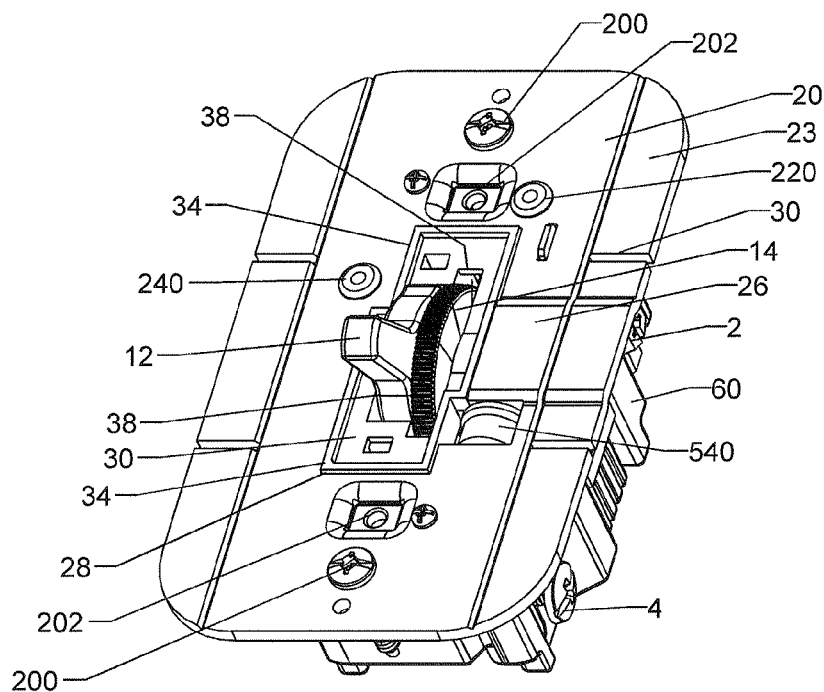
FIG. 6 is a perspective view of the frameless toggle switch and variable actuator control mechanism depicted in FIG. 5 without the cover plate.

FIG. 6 is a perspective view of the frameless toggle variable actuator switch depicted in FIG. 5 without the cover plate. All of the features depicted in FIGS. 2 and 4, and their corresponding reference numerals, are almost identical in FIG. 6. Like FIG. 4, the separator 30 embodiment of FIG. 6 is frameless. The embodiment depicted in FIG. 6 differs from the previous embodiments in two other respects. First, the heat sink 20 includes removable tab members 23. The heat sink 20 in this embodiment is configured for a relatively higher power handling (e.g., 700 W vis á vis 1100 W) and the related heat dissipation. The other difference relates to the presence of the preset variable actuator control 540. One will immediately note that the preset variable actuator control 540 is hidden behind cover plate 1 in FIG. 5. The preset variable actuator control 540, as its name suggests, allows a user to manually preset the low end of the variable actuator control. If the variable actuator control is a dimmer, the preset variable actuator control 540 will preset the low end of the light intensity such that dimmer actuator 14 may vary the light intensity from the preset low end intensity to the maximum intensity provided by the lighting. Once the preset level is set, the user may install the cover plate 1 such that the preset variable actuator control 540 is hidden.

Figure 7:
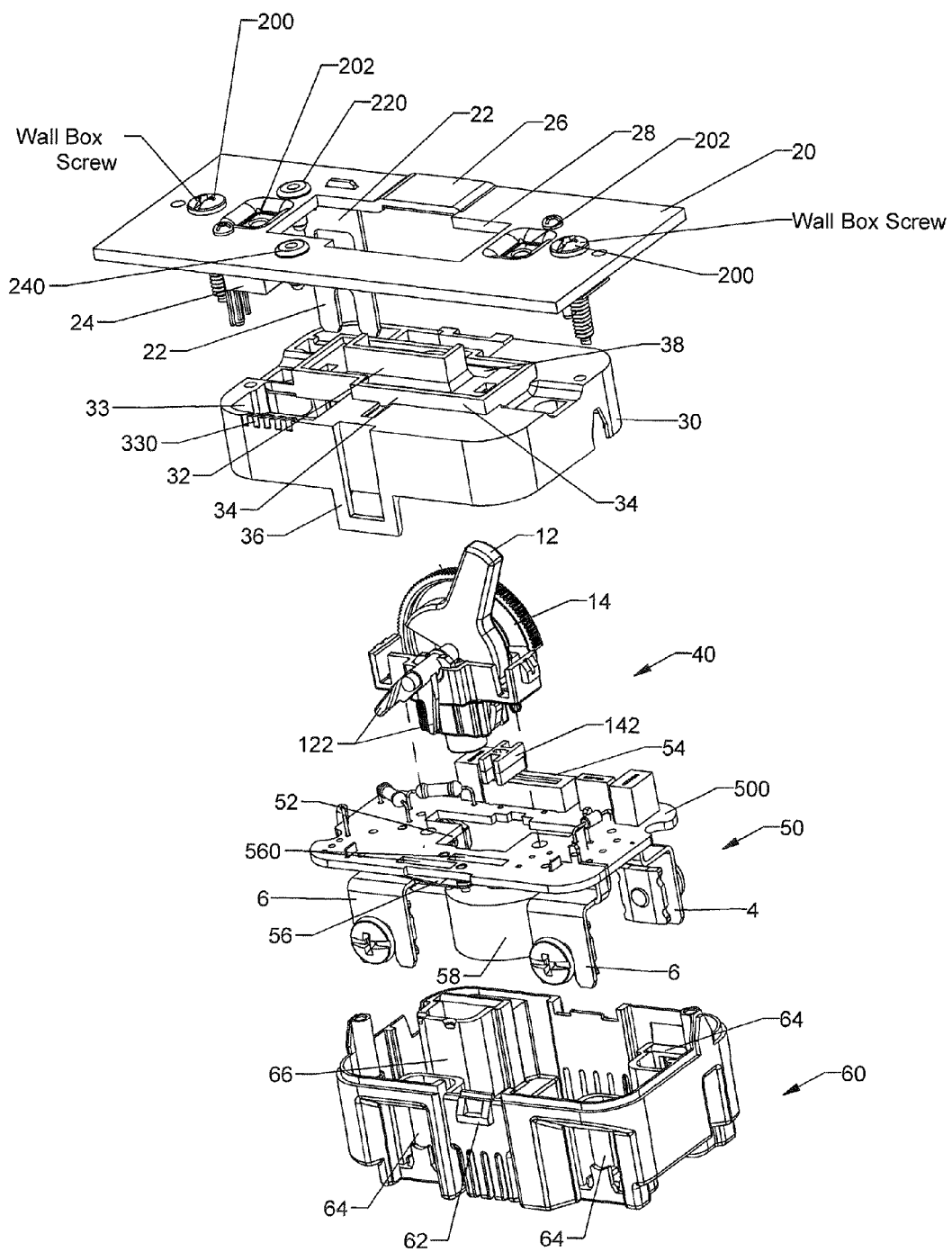
FIG. 7 is an exploded view of the toggle switch and variable actuator control mechanism depicted in FIGS. 1 and 2.

Referring to FIG. 7, an exploded view of the toggle variable actuator switch device 10 depicted in FIG. 1 is disclosed. Again, the heat sink 20 includes wall box mounting holes 200, ground terminal rivet 220, and TRIAC rivet 240. The heat sink 20 includes a raised portion 26 that formed a variable actuator link recess underneath heat sink 20. The heat sink 20 also includes an irregularly shaped opening 28 that registers and aligns with separator 30. A ground terminal 22 is mounted to the underside of the heat sink 20 by rivet 220. TRIAC 24 is also mounted to the underside of the heat sink via rivet 240. As those of ordinary skill in the art will appreciate, the TRIAC 24 is one example of an electronic power regulator used to control the amount of AC power consumed by an electrical load.

As described above, separator member 30 includes a half-frame 32, a registration member 34, a latch 36 and an opening 38. Separator 30 also includes a pocket 33 that is configured to accommodate TRIAC 24. The pocket 33 includes a vented portion 330 formed in the side wall of separator 30. The vented pocket 33 provides a thermal barrier between the TRIAC 24 and the printed circuit board assembly 50. In particular, there is a pocket floor (not shown) that is disposed between the TRIAC 24 and the circuit board assembly 50 when the device 10 is assembled.

The toggle switch 12 and the rotary variable actuator 14 are disposed in an modular actuator retainer assembly 40 that snaps into printed circuit board 500 in a manner that will be subsequently explained.

The printed circuit board assembly 50 includes various components mounted on a printed circuit board 500 that also provides electrical circuit traces that electrically interconnect the various components. The modular actuator retainer assembly 40 is configured to be mounted within a central opening 52 formed in a central portion of circuit board 500. A slide potentiometer 54 is disposed on one side of opening 52 along a lateral edge of circuit board 500. A linkage element 142 is connected to the slide portion of the slide potentiometer. The linkage element 142 couples to another linkage element (not shown in this view) disposed on the rotary variable actuator 14. Switch traveler contacts 56 are disposed on the opposite side of opening 52 along the opposing lateral edge of circuit board 500. In the example embodiment of FIG. 5, there are two travelers 56 disposed on the underside of printed circuit board 500 and are accessible to toggle switch actuators 122 via slots 560 formed in printed circuit board 500. Each of the two travelers is connected to a corresponding traveler terminal 6 via printed circuit board connections. One of the travelers is connected to the line hot terminal 4 depending on the state of toggle switch 12. A toroidal choke 58 is connected to the circuit board 500 at one end thereof and is cantilevered in the manner shown under opening 52.

The printed circuit board assembly 50 is inserted into the back body member 60 such that the terminals 2, 4, 6 are accessible via the recessed portions 64. The back body snap 62 mates with the latch 36 of the separator 30.

Figure 8:
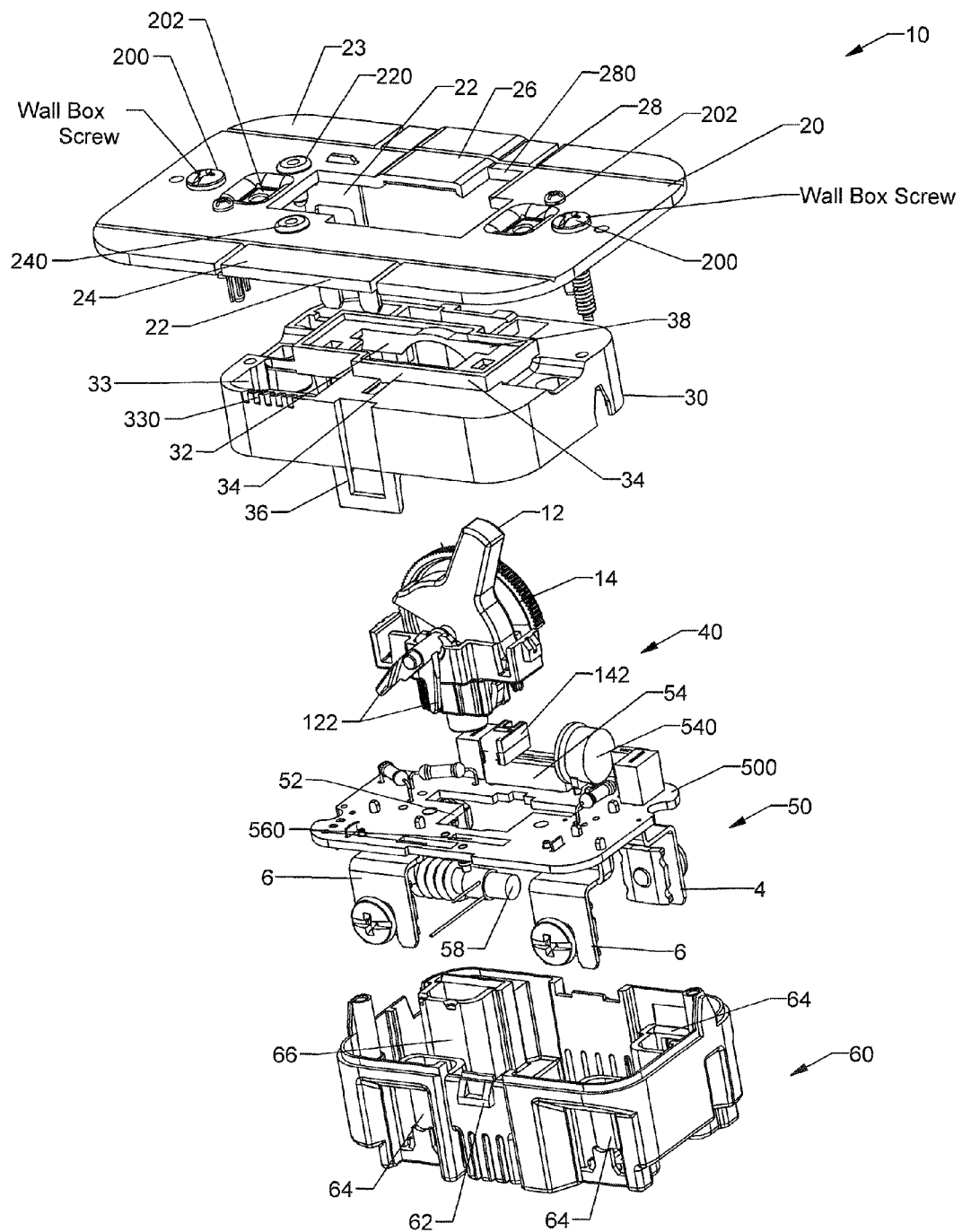
FIG. 8 is an exploded view of the toggle switch and variable actuator control mechanism depicted in FIGS. 5 and 6.

As embodied herein and depicted in FIG. 8, an exploded view of the toggle switch and variable actuator control mechanism depicted in FIGS. 5 and 6 is disclosed. The embodiment depicted in FIG. 8 is quite similar to the embodiment shown in FIG. 7. Thus, the description provided herein omits repetitive features. As noted above, the heat sink 20 in this embodiment is configured for a relatively higher power handling and the related heat dissipation. The heat sink 20 includes tabs 23 that may be removed by the installer. The separator 30 shown in this view is frameless. The modular switch actuation assembly 40 is identical to that depicted in the previous drawings. This embodiment also depicts the preset variable actuator control 540 in relation to variable actuator 54 and printed circuit board 500. When device 10 is assembled, the preset variable actuator control 540 extends though opening 39 in separator 30 and opening 280 in heat sink 20 such that it is accessible to the user before the cover plate 1 is installed (See FIGS. 5 and 6). The choke coil 58 in this embodiment is relatively more robust than the choke coil shown in FIG. 7 because it must handle the higher currents associated with the higher power rating (e.g., 1100 W).

Figure 9:
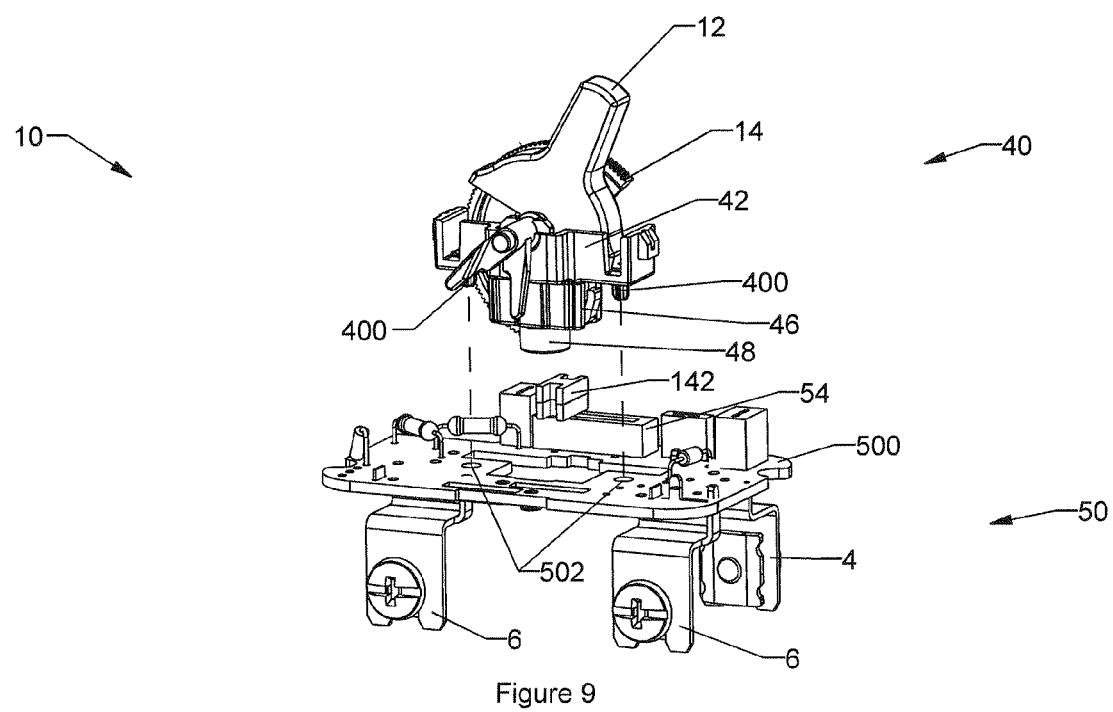
FIG. 9 is an exploded view of the toggle switch and variable actuator control mechanism and printed circuit board in accordance with the embodiments of either FIG. 1 or FIG. 3.

FIG. 9 is an exploded detail view of the modular actuator retainer assembly 40 and printed circuit board assembly 50 in accordance with the embodiments of either FIG. 1 or FIG. 3. Note that modular actuator retainer assembly 40 includes snap elements 400 disposed in the upper body portion 42. The snap elements 400 are configured to be inserted into openings 502 in the printed circuit board 500. Thus, the lower body portion 46 of the modular switch actuation assembly 40 is inserted into opening 52 and extends under the printed circuit board 500 in a manner that is described in more detail below.

Figure 10A:
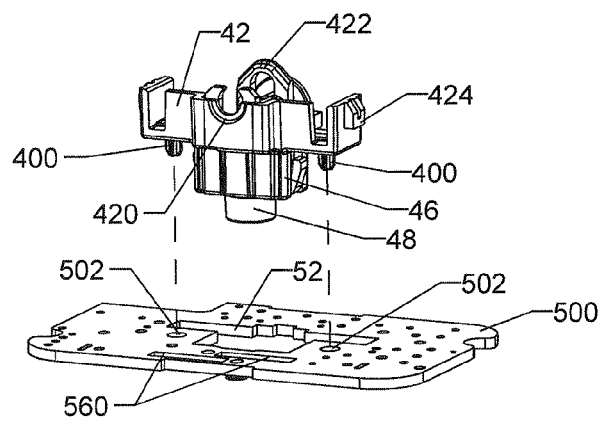
FIGS. 10A-10B are various views of the actuator retainer and printed circuit board in accordance with the embodiments of either FIG. 1 or FIG. 3.
Figure 10B:
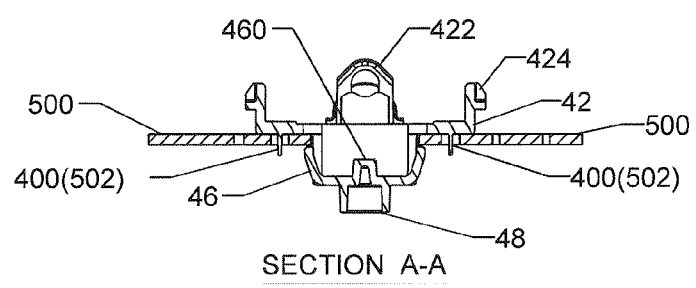

FIGS. 10A-10B are various views of the actuator retainer and printed circuit board in accordance with the embodiments of either FIG. 1 or FIG. 3. FIG. 10A shows the modular actuator retainer assembly 40 without the toggle switch 12 or the rotary variable actuator 14. The upper actuator retainer portion 42 includes a trunnion lock 420 and a trunnion slot 422 that engage trunnions integrally formed on either side of the toggle switch 12. The trunnions, of course, are small cylindrical projections on either side of the toggle switch 12 that define a switch axis of rotation upon which toggle switch 12 pivots in response to user actuation. The upper actuator retainer portion 42 also includes upper portion snap elements 424 on either end thereof. The upper portion snap elements 424 mate with a portion of the separator member 30 during assembly, in a manner that will be described in more detail below. The modular actuator retainer assembly 40 also includes a lower actuator retainer portion 46 that is inserted into the central opening 52 of printed circuit board 500 and extends below the printed circuit board 500 when the snap elements 400 are inserted into openings 502. The lower actuator retainer portion 46 includes a choke stand-off portion 48 that extends therefrom. The choke stand-off 48 prevents the toroidal choke 58 from interfering with rotary variable actuator 14.

FIG. 10B is a cross-sectional view of the printed circuit board 500 along a central longitudinal axis with the printed circuit board 500. As the lower actuator retainer portion 46 is inserted into opening 52, the choke stand-off member 48 is seen to be in substantial alignment with a vertical axis that includes the trunnion lock 420, the trunnion slot 422, and a switch spring retainer portion 460 formed in the interior of the lower actuator retainer portion 46. The switch spring retainer portion 460 will be described in more detail below in conjunction with a detailed description of the toggle switch 12.

Figure 11A:
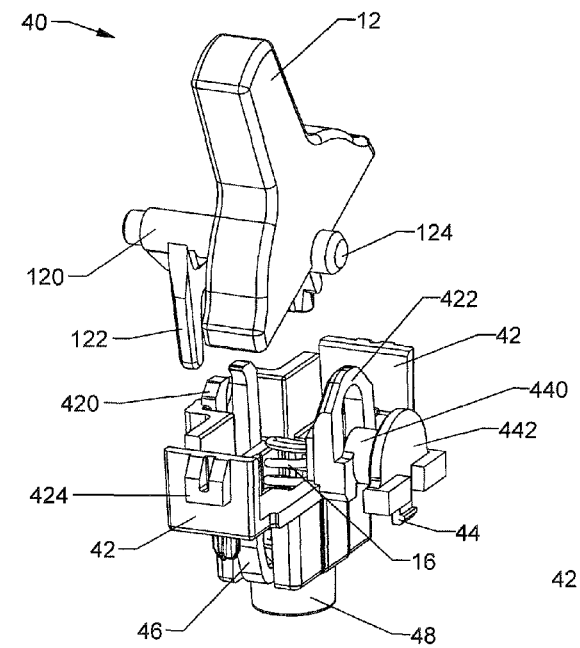
FIGS. 11A-11D are exploded and perspective views of the toggle switch and variable actuator in relation to the actuator retainer member.
Figure 11C:
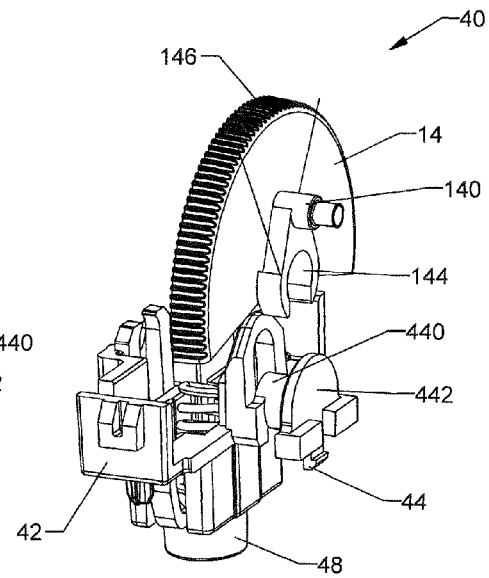
Figure 11B:
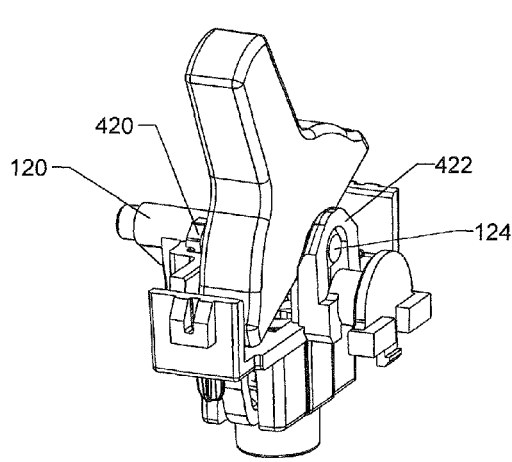

Referring to FIG. 11A-11D, exploded views of the toggle switch 12 and the rotary variable actuator 14 in relation to the modular actuator retainer assembly 40 are disclosed. FIG. 11A shows toggle switch 12 in relation to the actuator retainer 40. In particular, toggle switch 12 includes a trunnion 120 that mates with trunnion lock 420. Trunnion 120 includes toggle switch actuators 122 extending from an underside portion of the trunnion 120 at a location outboard of where trunnion 120 mates with trunnion lock 420. Toggle switch 12 also includes a relatively short trunnion 124 that is configured to be inserted into trunnion slot 422. As noted previously, trunnion 120 and trunnion 124 are cylindrical elements that define the axis of rotation of the toggle switch 12. As switch 12 rotates between the double-throw switch positions, the actuators 12 move accordingly. FIG. 11B is a perspective view of FIG. 11A that shows the toggle switch 12 within the modular actuator retainer assembly 40.

FIG. 11A also shows a shaft 440 that includes an end stop 442. These elements are disposed in a side-by-side relationship with trunnion slot 422 and are employed to seat the rotary variable actuator 14 within the modular actuator retainer assembly 40 alongside the toggle switch 12. Thus, the toggle switch 12 is separated from the rotary variable actuator 14 only by the relatively thin width of the trunnion slot 422.

FIG. 11C is an exploded view that shows the rotary variable actuator 14 in relation to the actuator retainer 40. As an initial point, the rotary variable actuator 14 is not fully circular; the solid portion of the rotary variable actuator 14 constitutes a reflex angle, i.e., an angle greater than 180 degrees. The cutaway portion of the variable actuator 14, therefore, forms an obtuse angle (i.e., between 90 and 180 degrees). Thus, the sum of the reflex angle and the obtuse angle must equal 360 degrees. The cutaway portion of the variable actuator 14 represents both a cost and a space savings. The cutaway portion reduces the size of the variable actuator 14. This feature results in a modular actuator retainer assembly 40 with a reduced profile. In turn, the overall device thickness is reduced. The spatial savings results material savings which reduces costs.

Figure 11D:
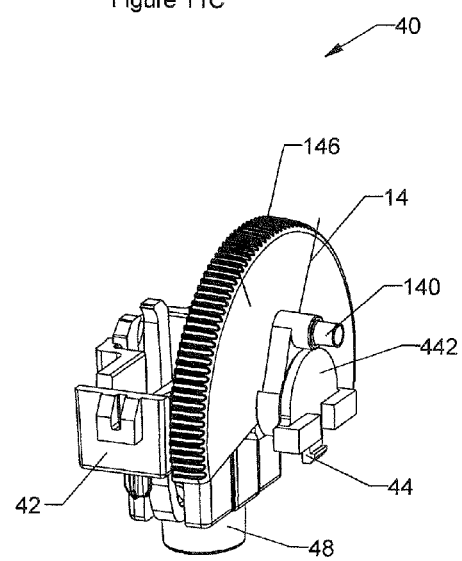

The rotary variable actuator 14 includes a linkage portion 140 that mates with the previously described linkage portion 142 to actuate the slide potentiometer 54. The rotary variable actuator 14 also includes a snap pocket 144 that is configured to mate with the barrel trunnion 440. The rotary variable actuator 14 is prevented from slipping off the end of the shaft 440 by the end stop 442. Finally, the rotary variable actuator 14 includes a serrated portion 146 that provides the user with a tactile surface when adjusting the rotary variable actuator 14. FIG. 11D is a perspective view of FIG. 11C that shows the rotary variable actuator 14 assembled within the modular actuator retainer assembly 40.

Referring to FIGS. 12A-12E, perspective views of the variable actuator 14, variable actuator linkage 142 and potentiometer 54 at various potentiometer settings are disclosed. In particular, these views illustrate the relationship between the angular rotation amount (A) and the linear displacement (X) of potentiometer 54. FIGS. 13 A-13 E are side views of the variable actuator, variable actuator linkage and potentiometer at the various potentiometer settings shown in FIGS. 12A-12E. Note that variable actuator linkage member 140 is disposed within a pocket formed within the H-shaped linkage member 142. The H-shaped linkage member 142 is disposed on the slide portion of the slide potentiometer 54. As the variable actuator 14 is rotated clockwise, the linkage member 140 also rotates such that linkage member 142 moves from left-to-right along the slide potentiometer 54. Thus, FIGS. 12A and 13A show the linkages (140, 142) at the farthest counter-clockwise position of the rotary variable actuator 14. This position, of course, corresponds to the lowest potentiometer 54 setting. In each successive Figure, the rotary variable actuator 14 is moved incrementally in the clockwise direction to move the slide potentiometer incrementally rightward until the slide potentiometer 54 is at its maximum setting in FIGS. 12E and 13E.

Figure 14A:
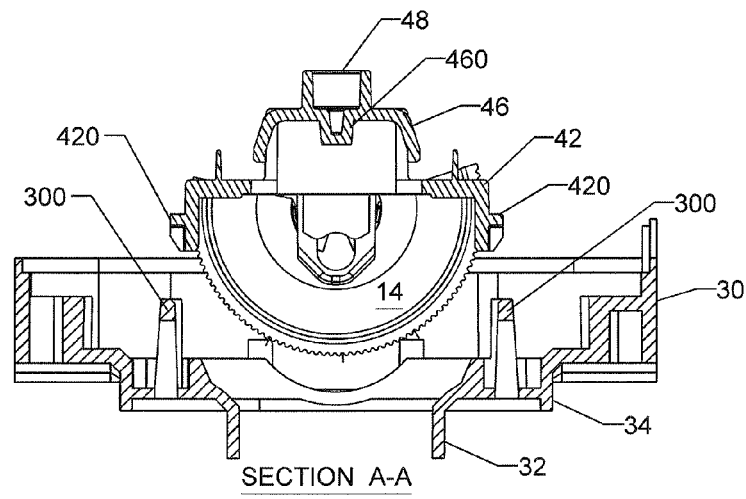
FIGS. 14A-14C are cross-sectional views illustrating the assembly of the modular switch actuation assembly and the separator in accordance with the present invention.
Figure 14B:
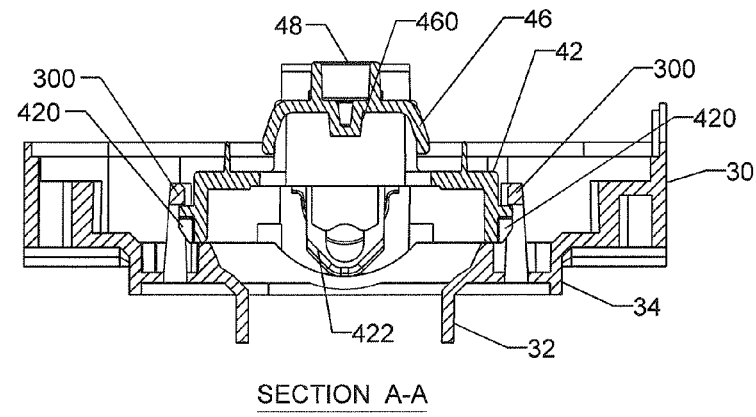
Figure 14C:
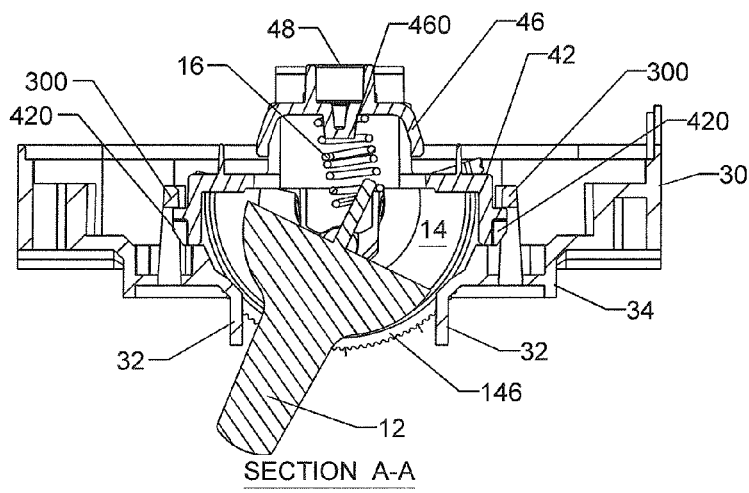

FIGS. 14A-14C show various cross-sectional views that illustrate the assembly of the modular switch actuation assembly 40. FIG. 14A is an exploded cross-sectional view of the actuator retainer and variable actuator disposed within the half-framed separator member 30 depicted in FIG. 1. The choke stand-off member 48 is shown at the very top of the drawings. As noted above, the choke stand-off 48 prevents the toroidal choke 58 (not shown in this view) from interfering with rotary variable actuator 14. Thus, the toroidal choke 52 is disposed between the choke stand-off member 48 and the rear inside major surface of the back body 60. The actuator retainer is shown with the rotary variable actuator 14 attached thereto. The toggle switch 12 is omitted for the sake of clarity. The separator 30 includes retainer guide members 300 which mate with the snap elements 420 of the upper actuator retainer portion 42.

FIG. 14B is a cross-sectional view of the modular actuator retainer assembly 40 that shows the snap elements 420 mated with the retainer guide members 300. FIG. 14B omits both the toggle switch 12 and the rotary variable actuator 14 for the sake of clarity of illustration. Taken together, FIGS. 14A and 14B illustrate the assembly of the modular actuator retainer assembly 40 within the separator member 30. The only difference between this embodiment and the embodiment depicted in FIG. 3 is that the embodiment of FIG. 3 does not include a frame 32 around the toggle switch 12 and the rotary variable actuator 14.

FIG. 14C is a cross-sectional view of the actuator retainer, toggle switch and variable actuator disposed within the half-framed separator member depicted in FIG. 1. Like FIG. 14B, FIG. 14C is a cross-sectional view of the modular actuator retainer assembly 40 that shows the snap elements 420 mated with the retainer guide members 300. Essentially, FIG. 14C shows a fully assembled actuator retainer whereas FIG. 14B does not include any components. Thus, the switch spring retainer portion 460, which is formed in the interior of the lower actuator retainer portion 46, is coupled to the toggle switch spring 16 at one end thereof. The other end of the spring 16 is connected to a bottom portion of the toggle switch. Thus, when a user toggles from a first switch position to a second switch position, spring element 16 applies a force that causes the toggle switch 12 to snap into the appropriate switch position. The handle portion of toggle switch 12 extends though the half-frame 32 and is accessible by the user.

Figure 15:
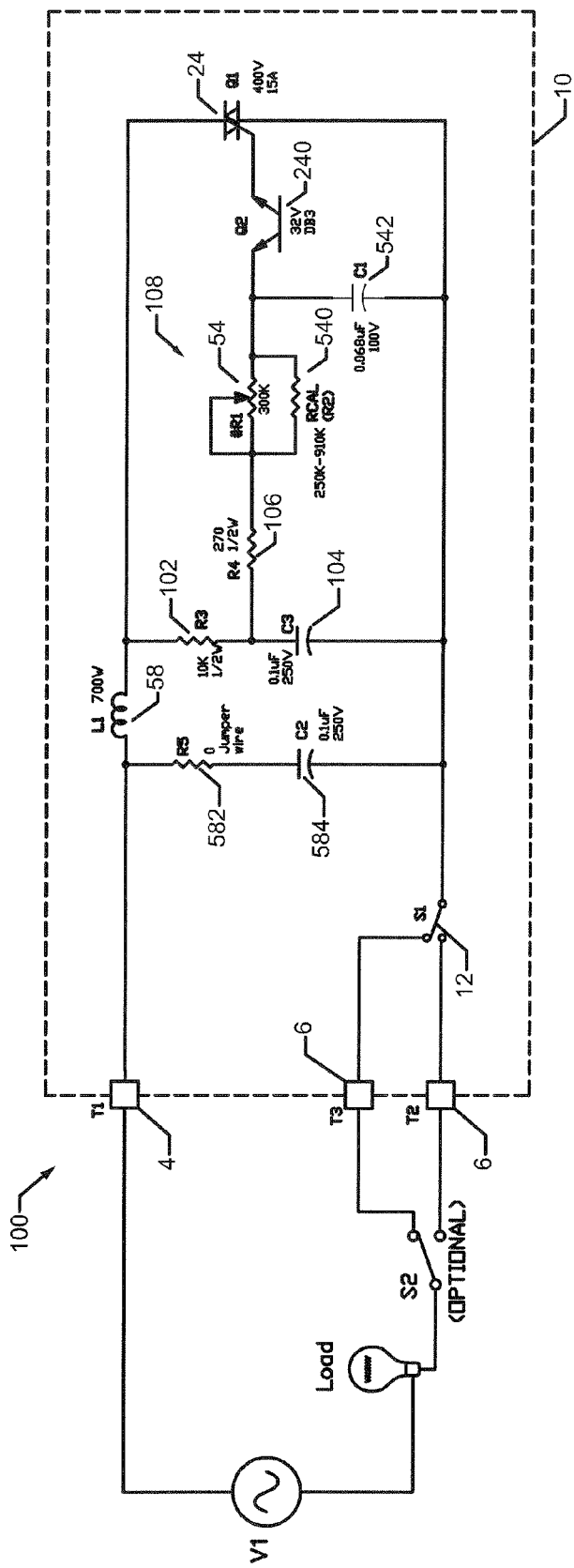
FIG. 15 is a schematic view of a circuit for a toggle switch and a variable actuator control in accordance with an embodiment of the invention.

As embodied herein and depicted in FIG. 15, a schematic view of a circuit for a toggle switch and a variable actuator control in accordance with an embodiment of the invention is disclosed. The dashed line indicates the portion of the schematic 100 that is disposed within device 10. Line hot terminal is connected to the source of AC power (V1). Traveler terminals 6 are connected to the traveler wires that extend from wall switch S2. Switch S2 is also connected to the source of AC power (V1) to complete the circuit. The traveler terminals 6 are also connected to the toggle switch 12 which turns device 10 ON/OFF.

Circuit 100 includes an RLC circuit that includes choke coil 58 in combination with resistor 582 and capacitor 584. The RLC circuit is configured to prevent device 10 from propagating electrical noise generated by TRIAC Q1 back towards AC source V1 and the electrical distribution system.

An RC circuit formed by resistor 102 and capacitor 104 is employed as a voltage regulation filter that substantially eliminates spurious high frequency noise from being transmitted to the variable actuator timing circuit 108. As those skilled in the art will appreciate, high frequency noise could be improperly interpreted by timing circuit 108 as an AC signal phase angle corresponding to the time to turn ON. By filtering out high frequency noise, the RC circuit helps maintain the proper timing of circuit 100. The variable actuator circuit 108 includes current limiting resistor 106 coupled to an RC circuit that includes potentiometer 54 and capacitor 542. The resistance of the RC circuit is the parallel resistance of potentiometer 54 and calibration resistor 539. The calibration resistor 539 is installed during manufacturing and ensures that the load emits some illumination at the lowest setting of the potentiometer (this corresponds to potentiometer 54 being set at its maximum resistance.) In any event, the charging time of capacitor 542 is equal to the RC time constant of the RC timing circuit 108. Thus, the resistance of potentiometer 54 determines the RC time constant. When the capacitor 542 is charged to the breakover voltage of DIAC 240, the DIAC 240 will conduct to turn TRIAC 24 ON for a predetermined portion of the AC half-cycle. In other words, circuit 100 is able to vary the amount of power provided to the load by altering the duty cycle of the AC half cycle. Subsequent to TRIAC 24 turning ON, the voltage at capacitor 542 is zeroed such that DIAC 240 and TRIAC 24 turn on at about the same phase angle for both the positive and negative half cycles. Although the switching device is shown as a TRIAC, those skilled in the art that other switching devices may be employed such as bi-polar transistors, MOSFETS, gate turn-off thyristors, and SCRs.

Figure 16:
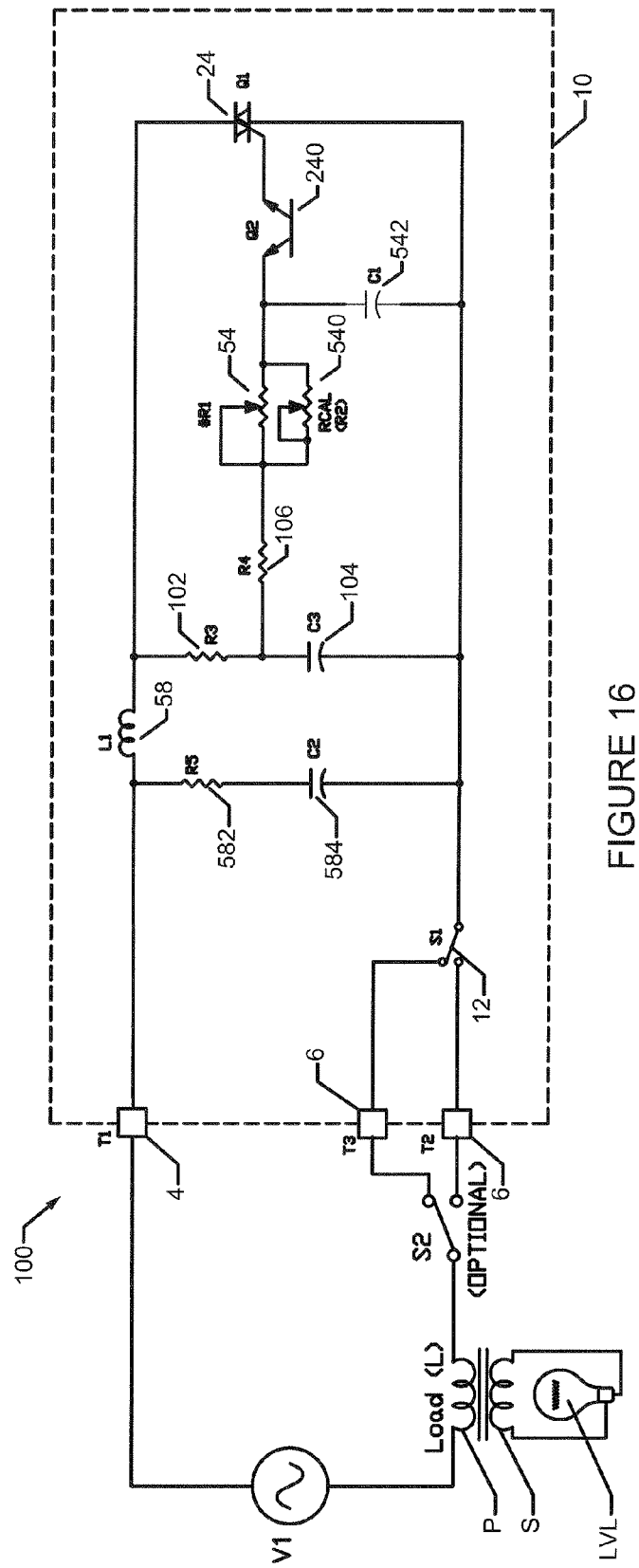
FIG. 16 is a schematic view of a circuit for a toggle switch and a variable actuator control in accordance with another embodiment of the invention.

As embodied herein and depicted in FIG. 16, a schematic view of a circuit for a toggle switch and a variable actuator control in accordance with another embodiment of the invention is disclosed. The dashed line indicates the portion of the schematic 100 that is disposed within device 10. The schematic of FIG. 16 is almost identical to the schematic of FIG. 15. Thus, for sake of brevity, only the differences between the two circuits will be discussed. The circuit 100 of FIG. 16 is directed to a low voltage lighting load application. Load L represents, e.g., a track lighting installation that includes a transformer T that has a primary P and a secondary S. The 120 VAC provided by AC voltage source is converted by the transformer T such that a low voltage power supply is provided to the transformer load, e.g. 12 V, for powering a low voltage light (LVL). Because of the variability associated with the load LVL, the calibration resistor 539 is implemented using preset variable control actuator 540 (trim potentiometer 540) that provides a variable low end adjustment.

Figure 17:
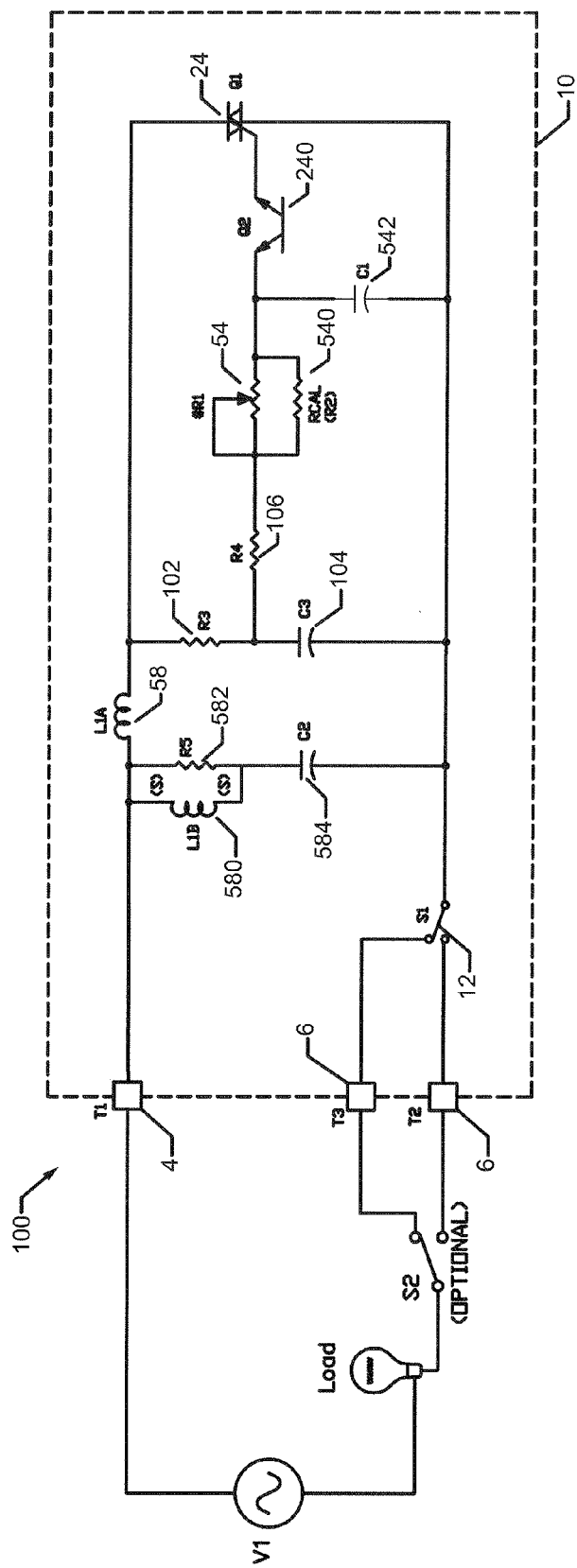
FIG. 17 is a schematic view of a circuit for a toggle switch and a variable actuator control in accordance with yet another embodiment of the invention.

As embodied herein and depicted in FIG. 17, a schematic view of a circuit for a toggle switch and a variable actuator control in accordance with yet another embodiment of the invention is disclosed. The dashed line indicates the portion of the schematic 100 that is disposed within device 10. Line neutral terminal 4 is connected to the source of AC power (V1). Traveler terminals 6 are connected to the traveler wires that extend from wall switch S2. Switch S2 is also connected to the source of AC power (V1) to complete the circuit. The layout of schematic of FIG. 17 is almost identical to the layout of schematic of FIG. 15 and, therefore, the description of identical circuitry is omitted for the sake of brevity. FIG. 17 is a relatively high power handling circuit of the type depicted in FIGS. 5 and 6. Thus, the choke coil of the RLC circuit includes coil 58 in combination with coil 580, which is disposed in parallel with resistor 582. Reference is made to U.S. Pat. No. 6,188,214, which is incorporated herein by reference as though fully set forth in its entirety, for a more detailed explanation of the choke coil circuit implementation. The value of certain resistors may also be adjusted in light of the higher currents associated with the embodiment of FIG. 17.

Figure 18:
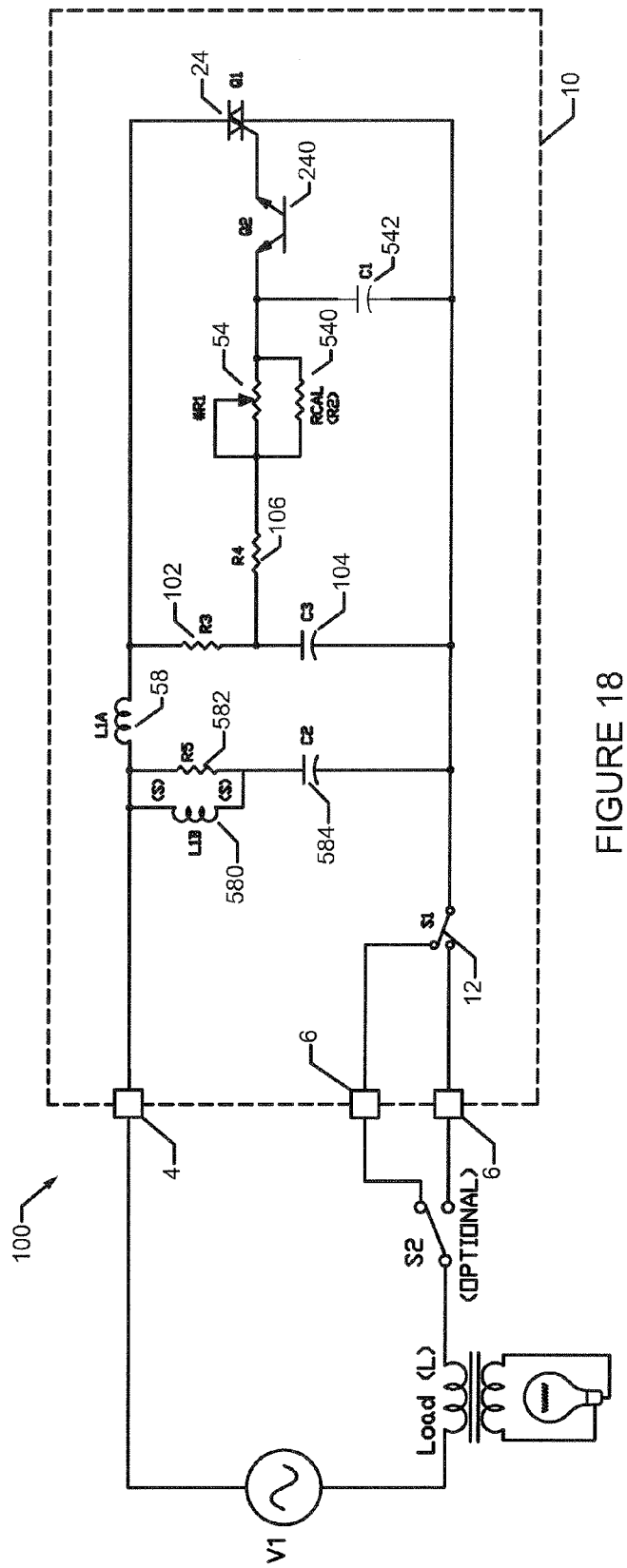
FIG. 18 is a schematic view of a circuit for a toggle switch and a variable actuator control in accordance with yet another embodiment of the invention.

As embodied herein and depicted in FIG. 18, a schematic view of a circuit for a toggle switch and a variable actuator control in accordance with yet another embodiment of the invention is disclosed. The dashed line indicates the portion of the schematic 100 that is disposed within device 10. The circuit of FIG. 18 is a relatively high power handling version of the circuit depicted in FIG. 16. The description of similar or identical circuitry, therefore, is omitted for the sake of brevity. Again, the choke coil of the RLC circuit includes coil 58 in combination with coil 580, which is disposed in parallel with resistor 582. Reference is made to U.S. Pat. No. 6,188,214, which is again incorporated herein by reference as though fully set forth in its entirety, for a more detailed explanation of the choke coil circuit implementation. The value of certain resistors may also be adjusted in light of the higher currents associated with the embodiment of FIG. 18.

Figure 19:
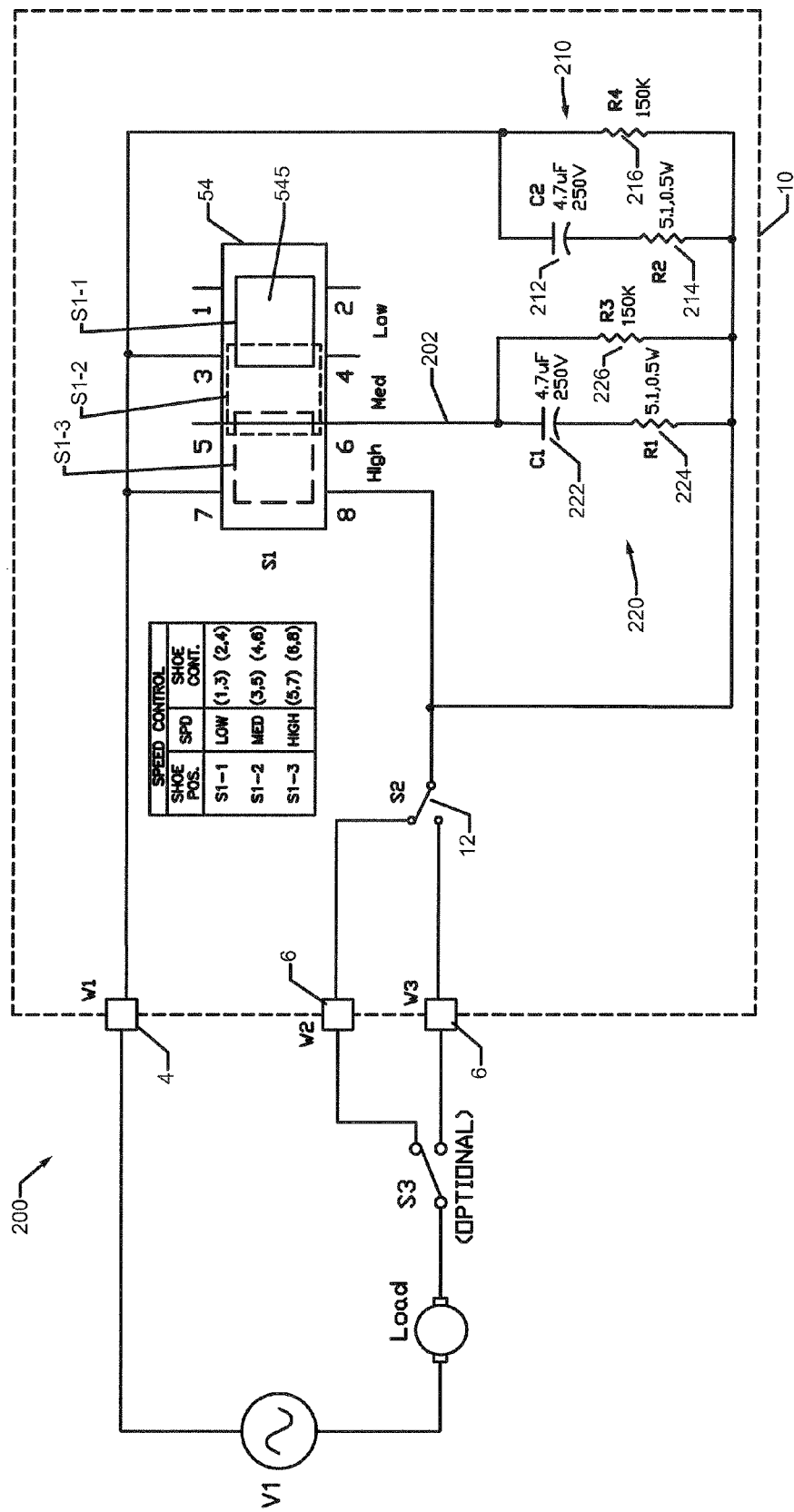
FIG. 19 is a schematic view of a circuit for a toggle switch and a variable actuator control in accordance with yet another embodiment of the invention.

As embodied herein and depicted in FIG. 19, a schematic view of a circuit for a toggle switch and a variable actuator control in accordance with yet another embodiment of the invention is disclosed. In this embodiment, the circuit 200 is a toggle switch and a dehummer variable fan speed control for the electric fan load (F). Circuit 200 includes slide switch 54 in combination with capacitive circuit 210 and capacitive circuit 220. The slide switch S1 includes a glider disposed in a switch housing that is mounted on the printed circuit board 500. The switch 54 includes dual contact springs on the bottom of the glider that interact with two rows of contacts. Each contact spring makes contact between adjacent contacts in the same row as the contact spring. Reference is made to U.S. Pat. No. 6,841,749, which is incorporated herein by reference as though fully set forth in its entirety, for a more detailed explanation of the slide switch 54 for the fan control circuit 200. Referring to schematic circuit 200, the glider 545 is shown on switch 54 at a low speed switch position S1-1 by a solid line, at a medium speed switch position S1-2 by a dashed line, and at a high speed switch position by a dotted line. At switch position S1-1, the contacts 1, 3 and 2, 4 are connected by the glider 545. Because contacts 1, 2 are not used, only capacitor circuit 210 is connected between line neutral terminal 4 and toggle switch 12. The inductive reactance of the fan and the capacitive reactance of the circuit form a voltage divider. The switch circuit 54 varies the capacitance of the circuit when the switch is in different positions. In switch position S1-2, contacts 3, 5 and 4, 6 are connected by the glider 545. Capacitor circuit 220 is disposed in parallel with capacitor circuit 210. Trace 202 is connected to contact 5 and thus to contact 3 by way of glider 545 when at position S1-2. Contact 3, as noted above, is connected to filter circuit 210. Thus, there is a reduced impedance between line neutral terminal 4 and toggle switch 43 and the fan speed is increased at position S1-2. When the glider position is moved to position S1-3, contacts 5,7 and 6,8 are connected. Since contacts 202 are shorted together by trace 202, contacts 7 and 8 are shorted together and the fan speed is at full power.

Figure 20:
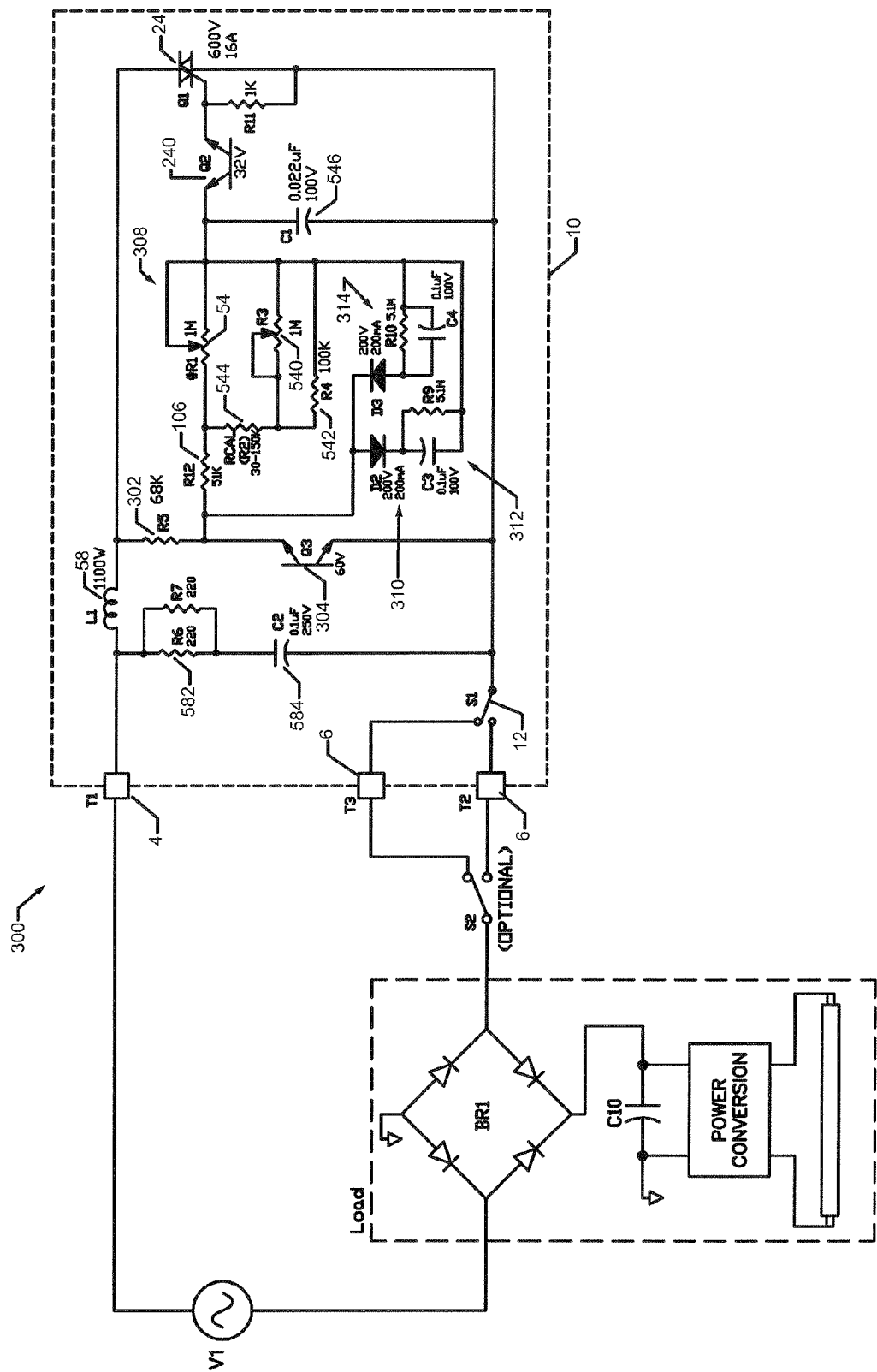
FIG. 20 is a schematic view of a circuit for a toggle switch and a variable actuator control in accordance with another embodiment of the invention.

As embodied herein and depicted in FIG. 20, a schematic view of a circuit for a toggle switch and a variable actuator control in accordance with another embodiment of the invention is disclosed. In this embodiment, the load includes a fluorescent light ballast configured to power a fluorescent light. The layout of circuit 300 is similar to the previous embodiments. The choke coil of the RLC circuit includes coil 58 which is disposed in series with resistors 582. As noted above, this circuit prevents noise generated by TRIAC 24 from propagating back into the electrical distribution system. The voltage regulation circuit includes resistor 302 and DIAC 304. This circuit is different from the voltage regulator circuits disclosed in the previous embodiments. Because the circuit 300 is designed for a fluorescent ballast load, DIAC 304 is employed instead of a capacitor because it is more robust noise filter. The fluorescent light load is more susceptible to voltage variations. DIAC 304 clamps the voltage at 60 V. The variable actuator circuitry 308 is more complicated than the circuitry employed in previous embodiments. Again, resistor 306 is a current limiting resistor.

The variable actuator circuitry 308 has four resistive components including user potentiometer 54 and trim potentiometer 540. Trim potentiometer 540 is disposed in parallel with resistor 542 and is employed by the user to adjust the low end setting of the dimmer. As shown in FIGS. 5 and 6, preset variable control actuator (trim potentiometer) 540 is hidden by wall plate 1. Calibration resistor 544 is carefully selected during manufacturing such that the lowest setting of the trim potentiometer 540 results in a minimum low level illumination of the florescent light. Thus, resistor 544 sets the absolute lowest dimmer setting, i.e., when potentiometer 54 and trim potentiometer 540 are at their lowest adjustment settings.

Circuit 300 includes a starting circuit 310 that is not included in any of the previous embodiments. Starting circuit 310 is disposed in parallel with the variable actuator circuitry 308 and is configured to shunt current around the actuator circuit 308 to DIAC 240 at start-up. Essentially, the ballast presents a high impedance to TRIAC 24 and, therefore, TRIAC 24 would not turn ON if not for the starting circuit 310. By turning DIAC 240 and TRIAC 24 ON at full output, the charging current through capacitor C10 becomes great enough for TRIAC 24 to turn ON. The fluorescent light will turn ON within 8-10 AC line cycles. As soon as the fluorescent light illuminates, there will be enough load current to keep TRIAC 24 ON. In state of the art fluorescent dimmers, a mechanical solution is employed to address the "mechanical" fluorescent ballast starting solution. In other words, one must turn the light ON using the full-power setting of the dimmer and adjust the dimmer to a desired setting thereafter. The present invention eliminates the mechanical fluorescent ballast starting solution and replaces it with an electronic starter circuit that allows the user to preset the florescent light at a desired intensity.

In particular, starting circuit 310 includes circuit 312 and circuit 314. Circuit 312 shunts current to DIAC 240 during the positive half-cycles of AC power, whereas circuit 314 shunts current to DIAC 240 during the negative half cycles of AC power. Thus, circuits 312 and 314 alternate between half-cycles of AC power until capacitors C3 and C4 are fully charged. Due to the charging, DIAC 240 is turned ON early in each AC half cycle so TRIAC 24 is ON at full power. Due to the fact that it takes longer than 8-10 AC line cycles for the capacitors to fully charge, circuits 312 and 314 assure that the fluorescent light will illuminate. Capacitors C3 and C4 eventually charge fully at which point circuits 312 and 314 have little or no affect on TRIAC 24. Instead, the actuator circuit 308 begins to fire DIAC 240 at the phase angle setting dictated by variable actuation circuit 308 in the manner previously described. When line voltage is turned off by switch by S2 (if provided) or switch 12, resistors R9 and R10, respectively, will bleed (discharge) capacitors C3 and C4 within a relatively short period of time (e.g., about a half-second). This assures that circuits 312 and 314 will be ready to restart the electronic ballast load when line voltage is restored.

The output circuit comprising DIAC 240 and TRIAC 24 includes a resistor 242 that is connected to the gate of TRIAC 24. Once DIAC 240 is OFF, resistor 242 bleeds current away from the gate of TRIAC 24 to guarantee its turn-off. TRIAC 24 may be referred to as a "sensitive gate TRIAC" meaning that it is capable of turning ON at low values of load current.

Figure 21A:
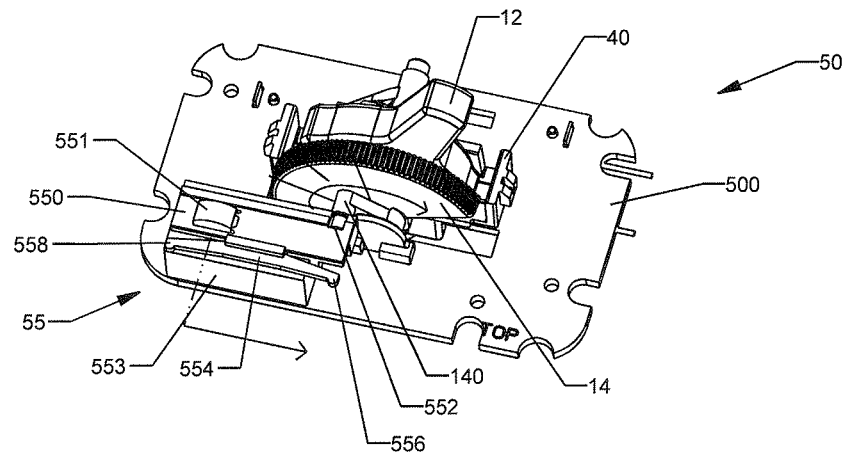
FIGS. 21A-21C are perspective views of the variable actuator, variable actuator linkage and slide switch in accordance with another embodiment of the present invention.
Figure 21B:
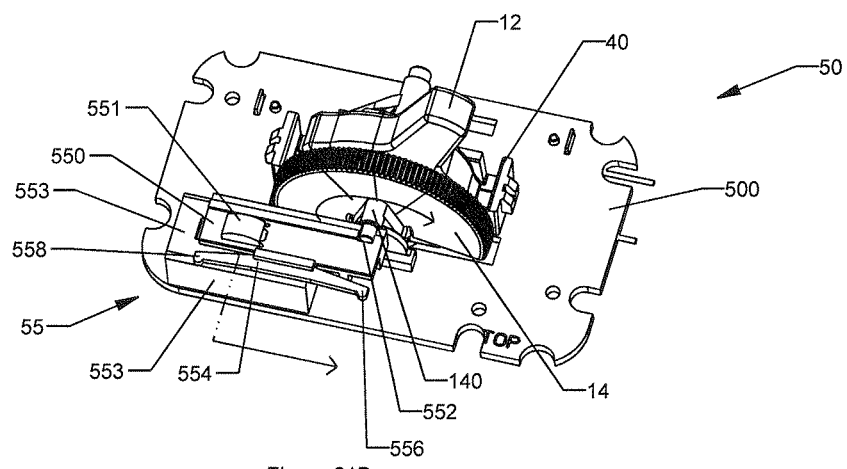
Figure 21C:
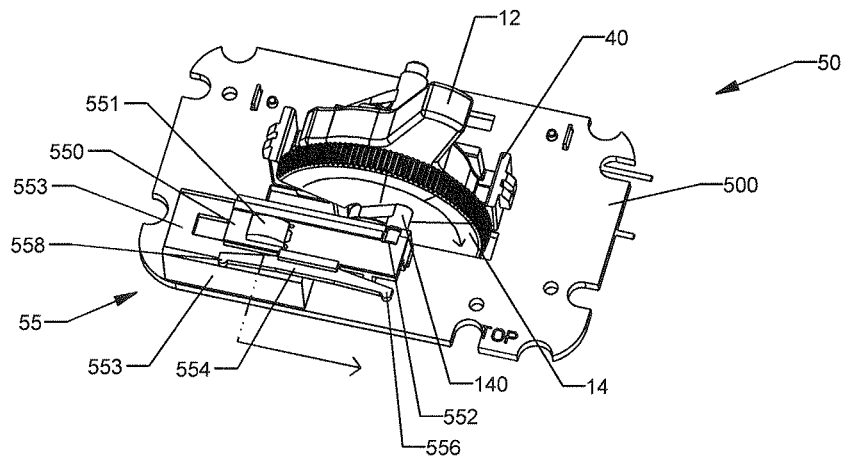

Referring to FIGS. 21A-21C, perspective views of the variable actuator, variable actuator linkage and slide switch in accordance with another embodiment of the present invention are disclosed. This embodiment corresponds to the toggle switch and variable fan speed control disclosed in FIG. 19 and the associated text. FIGS. 21A-21C show the toggle switch 12 and the rotary actuator 14 disposed in the modular switch assembly 40. The modular switch assembly is mounted within the printed circuit board in the manner previously described. The rotary actuator 14 mates with the slide switch 55 (S1). The slide switch 55 includes a slide actuator member 550 disposed over a lower slide body 553 which is also mounted on the printed circuit board 500. The slide actuator member includes an opening that accommodates a switch button 551 and a notch 552 that accommodates the linkage portion 140 therein. When the rotary actuator 14 is rotated by the user, the linkage portion 140 pulls the slide actuator member 550 in the direction indicated by the arrow such that switch button 551 moves the internal switch slider contacts from the LOW switch position to a higher speed switch position. In FIG. 21B, the slide switch 55 is shown in the MED fan speed position. FIG. 21C shows the slide switch 55 in the HIGH fan speed position. Thus, the linkage portion 140 converts the rotational movement of the rotary actuator 14 into a linear actuation motion of slide switch 55. Although three stepped switch positions are shown in FIG. 21, the invention is not to be limited to any particular number of positions.

The slide switch 55 also includes a flexible arm 554 which includes detents 556, 558 disposed on either end thereof. The function of the flexible arm 554 and detents 556, 558 is described below.

Those skilled in the art will understand that in this embodiment, the rotary actuator 14 is moved in discrete increments that correspond to the fan speed positions of the fan speed switch 55. In one alternate embodiment, these discrete positions may be discovered by the user through trial and error. In other words, as the rotary actuator 14 is incremented, the user will notice the speed of the fan changing. In another alternate embodiment, portions of the serrated surface 146 are removed and human readable indicia are printed or formed on the smoothed surface of dial 146 to indicate the fan speed position. For example, the letter "L" would be indicative of LOW, "M" for MEDIUM and "H" for HIGH. As noted herein, the switch speed is not limited to only three discrete positions. In such cases, numerical indicia (e.g., 1, 2, 3, 4, and 5) may be used to indicate the discrete position. Of course, other suitable indicia may be employed, such as combinations of colors or alphanumerics.

Figure 22A:
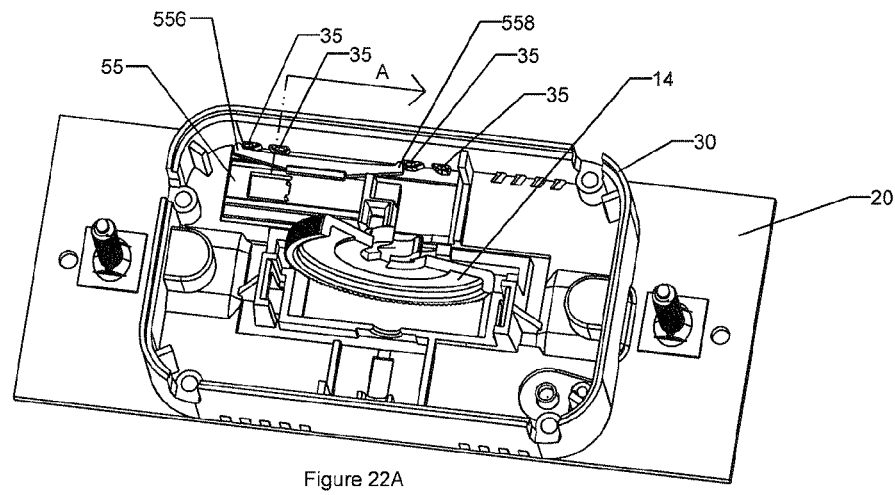
FIGS. 22A-22C are alternate perspective views of the variable actuator and slide switch depicted in FIGS. 21A-21C.
Figure 22B:
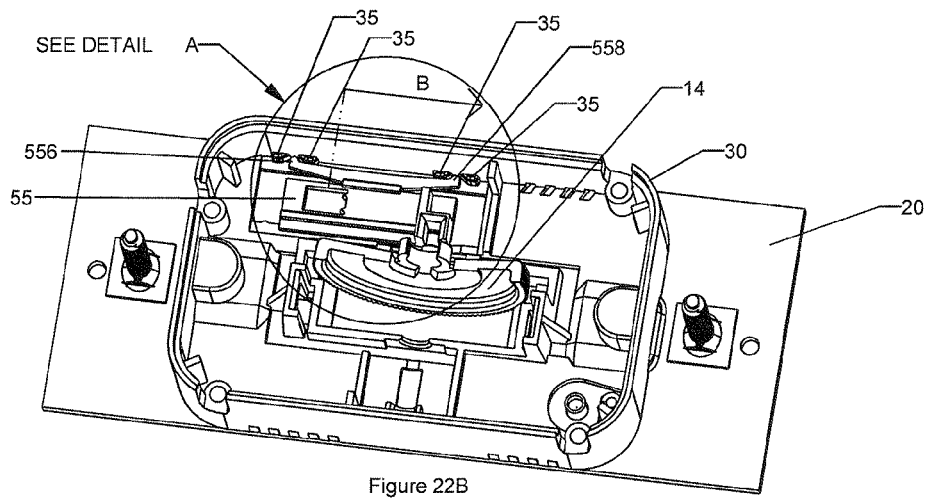
Figure 22C:
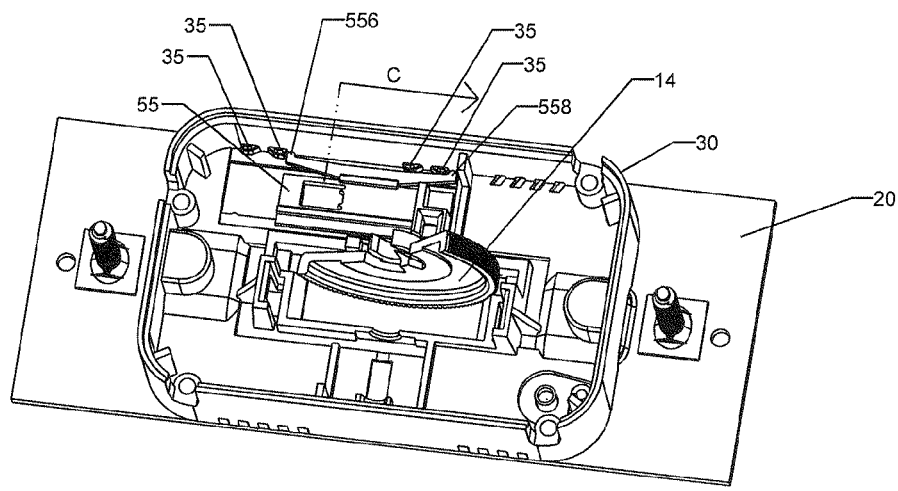

FIGS. 22A-22C are alternate perspective views of the variable actuator 14 and slide switch 55 depicted in FIGS. 21A-21C. These drawings show the rotary actuator 14 within the opening 38 of the separator 30. The separator member 30 includes four cammed stop elements 35. The cammed stop elements are divided into two pairs of stop elements 35. The leftward pair of stop elements 35 are configured to engage the detent 556 and the rightward pair of stop elements 35 are configured to engage the detent 558. Thus, the combination of the detents 556, 558 and the cammed stop elements 35 are used to resist any movement of the slide switch 55 away from the S1-1, S1-2 and S1-3 positions. See FIG. 19.

FIG. 22A corresponds to the LOW fan speed position shown in FIG. 21A. Detent 556 is disposed on the outboard side of the leftward pair of stop elements. Detent 558, on the other hand, is disposed on the inboard side of the rightward pair of stop elements. FIG. 22B corresponds to the MED fan speed position depicted in FIG. 21B. Note that detent 556 is disposed between the leftward pair of stop elements and detent 558 is disposed between the rightward pair of stop elements 35. FIG. 22C corresponds to the HIGH fan speed position shown in FIG. 21C. Detent 556 is disposed on the inboard side of the leftward pair of stop elements. Detent 558, on the other hand, is disposed on the outboard side of the rightward pair of stop elements and adjacent to the end stop feature 350 protruding from the interior side of separator 30.

Figure 23:
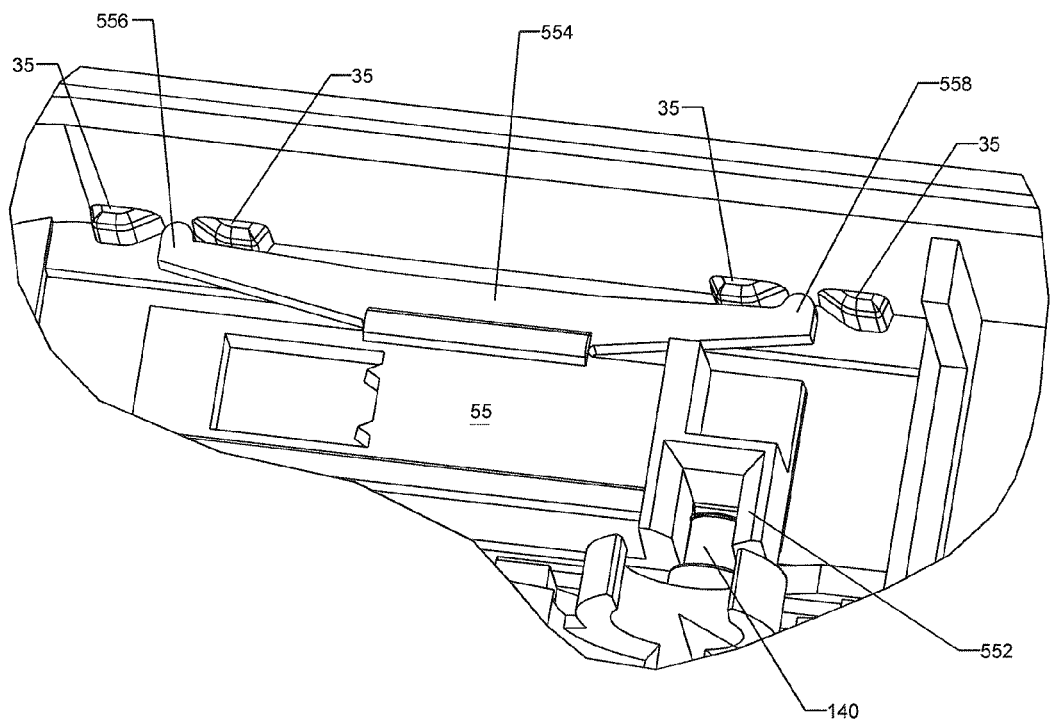
FIG. 23 is a detail view of the separator structure depicted in FIGS. 22A-22C.

FIG. 23 is a detail view of the separator structure depicted in FIG. 22B. This view clearly shows the position of detent 556 between the leftward pair of stop elements as well as the position of detent 558 between the rightward pair of stop elements 35. The linkage mechanism 140 is also shown within the notch 552. The depth of the notch 552 allows the linkage portion 140 to move up and down with the movement of the rotary actuator 140.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A device for controlling electrical power provided to at least one electrical load, the device being configured to be mountable in a wall box and covered by a wall plate having a wall plate opening disposed in a substantially central portion of the wall plate, the device comprising:

a device housing including a front body member coupled to a back body member, the front body member comprising a front major surface including a front major surface opening disposed at a substantially central portion thereof in substantial alignment with the wall plate opening, the front major surface opening being characterized by at least one longitudinal side and at least one latitudinal side, the device housing including a plurality of control terminals;

a modular switch actuation assembly including an actuator retainer housing coupled to the device housing, the actuator retainer housing including a toggle actuator disposed adjacent to a variable control actuator in a side-by-side arrangement within the actuator retainer housing with no framing or support structure disposed therebetween, the toggle actuator and the variable control actuator extending through the front major surface opening, the variable control actuator including a control surface disposed adjacent a substantial portion of the at least one longitudinal side, the toggle actuator including a rotatable axial toggle mounting structure coupled to the actuator retainer housing, the variable control actuator including a rotatable axial variable control mounting structure coupled to the actuator retainer housing, the axial toggle mounting structure and the axial variable control mounting structure being substantially parallel to a central latitudinal axis, the actuator retainer housing including a stopping portion configured to limit a rotational movement of the toggle actuator between a first predefined position and a second predefined position; and an electronic control circuit coupled to the plurality of control terminals and the modular switch actuation assembly, the electronic control circuit being configured to respond to actuations of the toggle actuator and/or the variable control actuator.

2. The device of claim 1, wherein the electronic control circuit includes a continuously variable control circuit coupled to the variable control actuator.

3. The device of claim 2, wherein the continuously variable control circuit includes a thyristor switching element.

4. The device of claim 3, wherein the front body member includes a heat sink thermo-dynamically coupled to the thyristor switching element.

5. The device of claim 2, wherein the variable control actuator includes a rotary dimming actuator coupled to the continuously variable control circuit via a linkage assembly.

6. The device of claim 2, wherein the continuously variable control circuit includes a slide potentiometer coupled to the variable control actuator.

7. The device of claim 1, wherein the electronic control circuit further comprises a printed circuit board having a printed circuit board opening disposed in an interior portion thereof, the actuator retainer housing being at least partially disposed in the printed circuit board opening.

8. The device of claim 7, wherein the variable control actuator includes a rotary actuator coupled to a slide potentiometer via a linkage element, the slide potentiometer being disposed proximate a first lateral edge of the printed circuit board.

9. The device of claim 7, wherein the toggle actuator is coupled to at least one switch actuator disposed proximate a second lateral edge of the printed circuit board opposite the first lateral edge.

10. The device of claim 1, wherein the electronic control circuit further comprises a variable power control circuit including a plurality of discrete power settings, the variable control actuator including a rotary actuator having a plurality of discrete rotational positions, each of the plurality of discrete rotational positions corresponding to one of the plurality of discrete power settings.

11. The device of claim 10, wherein the variable power control circuit includes a slide switch configured to move between the plurality of discrete power settings, the rotary actuator being configured to actuate the slide switch via a linkage mechanism.

12. The device of claim 11, wherein the rotary actuator includes a pin element coupled to the linkage mechanism, the pin element being moveable between the plurality of discrete rotational positions by actuation of the rotary actuator, each of the plurality of discrete rotational positions corresponding to a discrete linear position of the slide switch.

13. The device of claim 10, wherein each of the plurality of discrete rotational positions correspond to one of a plurality of capacitance elements, each of the plurality of capacitance elements corresponding to a predetermined capacitance value.

14. The device of claim 1, wherein the variable control actuator includes a substantially semi-circular wheel portion having a user accessible edge.

15. The device of claim 14, wherein the substantially semi-circular wheel portion defines a reflex angle.

16. The device of claim 1, wherein the axial toggle mounting structure includes at least one toggle trunnion element, and wherein the actuator retainer housing includes at least one first snap fit element configured to accommodate the at least one toggle trunnion element.

17. The device of claim 16, wherein the axial variable control mounting structure includes a second snap fit element, and wherein the actuator retainer housing including a mounting shaft configured to be engaged by the second snap fit element.

18. The device of claim 17, wherein the at least one toggle trunnion element corresponds to a toggle axis and the mounting shaft corresponds to a variable control axis, the toggle axis and the variable control axis being substantially parallel to the central latitudinal axis.

19. The device of claim 18, wherein the toggle axis and the variable control axis are substantially co-linear.

20. The device of claim 1, wherein the actuator retainer housing includes a lower mounting portion, and wherein the electronic control circuit further comprises a printed circuit board having a printed circuit board opening disposed in an interior portion thereof, the lower mounting portion being configured to be mounted within the printed circuit board opening such that the toggle actuator and the variable control actuator are disposed on a front body member side of the printed circuit board and a standoff portion is disposed on a back body member side of the printed circuit board.

21. The device of claim 1, wherein the axial toggle mounting structure and the axial variable control mounting structure are substantially co-linear.

22. The device of claim 1, wherein the front body member includes a separator member.

23. The device of claim 22, wherein the actuator retainer housing is mounted to the separator.

24. The device of claim 22, wherein the electronic control circuit further comprises a printed circuit board, and wherein the actuator retainer housing is mounted to the separator and the printed circuit board.

25. The device of claim 22, wherein the separator member includes a frame member that extends through the front major surface opening to thereby frame at least the toggle actuator.

26. The device of claim 1, wherein the wall plate opening is characterized by a first minimum dimension of approximately 0.925 inches and a second minimum dimension of approximately 0.401 inches.

27. The device of claim 26, wherein the area formed by the first minimum dimension and the second minimum dimension is less than approximately 0.50 square inches.

28. The device of claim 1, wherein the electronic control circuit includes a starter circuit disposed substantially in parallel with a dimmer circuit, the starting circuit being configured to by-pass the dimmer circuit and couple a substantial portion of the electrical power to the at least one electrical load for a predetermined period of time when the electrical power is initially applied to the electronic control circuit, the at least one load includes a fluorescent ballast load.

29. The device of claim 28, wherein the dimmer circuit includes both a manual preset and a factory preset.

30. The device of claim 1, wherein the electronic control circuit includes a dimming circuit, the dimming circuit including both a manual preset and a factory preset.

31. The device of claim 1, wherein the modular switch actuation assembly further includes a spring element configured to drive the toggle actuator to the first predefined position and the second predefined position.

32. A device for controlling electrical power provided to at least one electrical load, the device being configured to be mountable in a wall box and covered by a wall plate having a wall plate opening disposed in a substantially central portion of the wall plate, the device comprising:

a device housing characterized by a longitudinal axis and a latitudinal axis, the device housing including a front body member coupled to a back body member, the front body member comprising a front major surface including a front major surface opening disposed at a substantially central portion thereof in substantial alignment with the wall plate opening, the device housing including a plurality of control terminals;

a modular switch actuation assembly including an actuator retainer housing having at least one mounting structure configured to be coupled to the device housing, the actuator retainer housing also including a toggle actuator disposed adjacent to a variable control actuator in a side-by-side arrangement extending through the front major surface opening, the actuator retainer housing being substantially bisected by the longitudinal axis, the toggle actuator including an axial toggle mounting structure coupled to the actuator retainer housing and the variable control actuator including an axial variable control mounting structure coupled to the actuator retainer housing, the axial toggle mounting structure and the axial variable control mounting structure being substantially parallel to the latitudinal axis, the actuator retainer housing including a stopping portion configured to limit a rotational movement of the toggle actuator between a first predefined position and a second predefined position; and an electronic control circuit including a variable impedance control element coupled to the variable control actuator by a linkage mechanism, the linkage mechanism converting a variable control actuator motion into a linear variable impedance control motion, the variable impedance control element being configured to control the electrical power provided to the at least one load via the variable control actuator, the variable impedance control element being disposed in a first lateral portion of the device housing and characterized by a first major axis that is parallel to and off-set from the longitudinal axis by the linkage mechanism.

33. The device of claim 32, wherein the toggle actuator is operatively coupled to a set of switch contacts disposed in a second lateral portion of the device housing and characterized by a second major axis that is parallel to and off-set from the longitudinal axis.

34. The device of claim 32, wherein the electronic control circuit includes a continuously variable control circuit coupled to the variable control actuator, the continuously variable control circuit including a thyristor switching element.

35. The device of claim 34, wherein the front body member includes a heat sink thermo-dynamically coupled to the thyristor switching element.

36. The device of claim 34, wherein the variable control actuator includes a rotary dimming actuator coupled to the continuously variable control circuit via a linkage assembly.

37. The device of claim 34, wherein the continuously variable control circuit includes a slide potentiometer coupled to the variable control actuator.

38. The device of claim 32, wherein the electronic control circuit further comprises a printed circuit board having a printed circuit board opening disposed in an interior portion thereof, the actuator retainer housing being at least partially disposed in the printed circuit board opening.

39. The device of claim 32, wherein the electronic control circuit further comprises a variable power control circuit including a plurality of linearly actuated discrete power settings, the variable control actuator including a rotary actuator having a plurality of discrete rotational positions, each of the plurality of discrete rotational positions corresponding to one of the plurality of linearly actuated discrete power settings.

40. The device of claim 39, wherein the variable power control circuit includes a slide switch mechanism, the slide switch mechanism including a flexible arm member having at least one detent structure disposed at an end thereof, the device housing including a plurality of stop elements disposed at an interior lateral portion thereof, the plurality of stop elements being configured to define a plurality of detent positions of the at least one detent structure, each of the plurality of detent positions corresponding to one of the plurality of linearly actuated discrete power settings.

41. The device of claim 40, wherein the at least one detent structure includes a first detent structure and a second detent structure disposed at either end of the flexible arm member.

42. The device of claim 39, wherein each of the plurality of discrete rotational positions correspond to one of a plurality of capacitance elements, each of the plurality of capacitance elements corresponding to a predetermined capacitance value.

43. The device of claim 32, wherein the axial toggle mounting structure includes at least one toggle trunnion element, the actuator retainer housing including at least one first snap fit element configured to accommodate the at least one toggle trunnion element, and wherein the axial variable control mounting structure includes a second snap fit element, the actuator retainer housing including a mounting shaft configured to be engaged by the second snap fit element.

44. The device of claim 43, wherein the at least one toggle trunnion element corresponds to a toggle axis and the mounting shaft corresponds to a variable control axis, the toggle axis and the variable control axis being substantially parallel to the central latitudinal axis.

45. The device of claim 32, wherein the wall plate opening is characterized by a first minimum dimension of approximately 0.925 inches and a second minimum dimension of approximately 0.401 inches, and wherein an area formed by the first minimum dimension and the second minimum dimension is less than approximately 0.50 square inches.

46. The device of claim 32, wherein the electronic control circuit includes a starter circuit disposed substantially in parallel with a dimmer circuit, the starting circuit being configured to by-pass the dimmer circuit and couple a substantial portion of the electrical power to the at least one electrical load for a predetermined period of time when the electrical power is initially applied to the electronic control circuit, the at least one load includes a fluorescent ballast load.

47. The device of claim 46, wherein the dimmer circuit includes both a manual preset and a factory preset.

48. The device of claim 32, wherein the modular switch actuation assembly further includes a spring element configured to drive the toggle actuator to the first predefined position and the second predefined position.

49. A device for adjustably controlling electrical power to at least one electrical load, the device being configured to be mountable in a wall box and covered by a wall plate having a single substantially central wall plate opening, the device comprising:

a device housing characterized by a longitudinal axis and a latitudinal axis, the device housing including a front body member coupled to a back body member, the front body member comprising a front major surface including a front major surface opening disposed at a substantially central portion thereof in substantial alignment with the wall plate opening, the device housing including a plurality of control terminals;

a printed circuit board member including an electronic control circuit, the electronic control circuit including a slide potentiometer offset from the longitudinal axis and disposed along a first lateral edge of the printed circuit board member, the electronic control circuit including a switch contact arrangement offset from the longitudinal axis and disposed along a second lateral edge of the printed circuit board member opposite the first lateral edge, the printed circuit board member including a board opening disposed between the slide potentiometer and the switch contact arrangement;

an electronic power regulator coupled to the electronic control circuit and disposed in a vented region of the front body member, the vented region including a thermal isolation barrier between the electronic power regulator and the printed circuit board; and an actuator retainer housing including a lower housing portion disposed in the board opening and coupled to the printed circuit board member, the actuator retainer housing also including a switching device disposed adjacent to a variable rotary control actuator in a side-by-side arrangement extending through the front major surface opening, the switching device including a switch actuator operatively coupled to the switch contact arrangement, the switching device being configured to move the switch actuator between a first switch position and a second switch position, the variable rotary control actuator including a linkage member configured to convert a variable rotary control actuator movement into a slide actuation of the slide potentiometer.

50. The device of claim 49, wherein the front body member further includes a heat sink member configured to be coupled to the wall box, the heat sink member including a substantially central heat sink opening not conforming to the wall plate opening, the heat sink further comprising a ground terminal, the electronic power regulator being mounted on an interior side of the heat sink.

51. The device of claim 50, wherein the front body member includes a separator portion having a registration member configured to align the separator within the heat sink opening.

52. The device of claim 51, wherein the separator includes the vented region.

53. The device of claim 49, wherein the wall plate opening is characterized by a first minimum dimension of approximately 0.925 inches and a second minimum dimension of approximately 0.401 inches.

54. The device of claim 53, wherein the area formed by the first minimum dimension and the second minimum dimension is less than approximately 0.50 square inches.

\* \* \* \* \*